US010673399B2

United States Patent
Elwailly et al.

(10) Patent No.: US 10,673,399 B2
(45) Date of Patent: *Jun. 2, 2020

(54) MULTIPORT AMPLIFIER INPUT NETWORK WITH COMPENSATION FOR OUTPUT NETWORK GAIN AND PHASE FREQUENCY RESPONSE IMBALANCE

(71) Applicant: Space Systems/Loral, LLC, Palo Alto, CA (US)

(72) Inventors: Farid Elwailly, San Jose, CA (US);
James Knecht, San Jose, CA (US);
David Grybos, San Jose, CA (US)

(73) Assignee: Space Systems/Loral, LLC, Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/405,162

(22) Filed: May 7, 2019

(65) Prior Publication Data

US 2019/0260340 A1 Aug. 22, 2019

Related U.S. Application Data

(60) Division of application No. 15/926,186, filed on Mar. 20, 2018, now Pat. No. 10,320,349, which is a
(Continued)

(51) Int. Cl.
*H03F 1/07* (2006.01)
*H03F 3/68* (2006.01)
(Continued)

(52) U.S. Cl.
CPC ............... *H03F 3/68* (2013.01); *H03F 3/189* (2013.01); *H04B 7/18513* (2013.01);
(Continued)

(58) Field of Classification Search
CPC ................... H03F 1/07; H03F 1/0288
(Continued)

(56) References Cited

U.S. PATENT DOCUMENTS

| 4,907,004 A | 3/1990 | Zacharatos et al. |
| 5,530,449 A | 6/1996 | Wachs et al. |

(Continued)

FOREIGN PATENT DOCUMENTS

| CN | 102394679 B | 7/2014 |
| EP | 0812027 B1 | 5/2005 |
| EP | 1532716 B1 | 5/2005 |

OTHER PUBLICATIONS

U.S. Appl. No. 15/628,140, filed Jun. 20, 2017.
(Continued)

*Primary Examiner* — Henry Choe
(74) *Attorney, Agent, or Firm* — Vierra Magen Marcus LLP

(57) ABSTRACT

Beamforming channels of a satellite are calibrated using a low power, spread spectrum calibration signal. The power of the calibration signal is below the noise level of a user signal in an active channel, allowing channels to be calibrated while active. When calibrating the transmit side circuitry, a two-stage calibration can be used, first calibrating the output hybrid matrix, then calibrating the whole of the transmit side. To improve performance, the dwell time spend calibrating a channel can be based on the power of the user signal in the channel. A transmit probe can be used to inject a calibration signal into the receive antennae and a receive probe can be used to extract the calibration signal from the transmit antennae. To reduce frequency of calibrations, the calibrations can be based on path-to-path differences. These techniques are also applied to multiport amplifiers (MPAs).

17 Claims, 17 Drawing Sheets

Related U.S. Application Data continuation-in-part of application No. 15/833,351, filed on Dec. 6, 2017, now Pat. No. 10,361,762.

(51) Int. Cl.

| | | |
|---|---|---|
| *H04B 17/21* | (2015.01) | |
| *H04B 7/204* | (2006.01) | |
| *H04B 7/185* | (2006.01) | |
| *H03F 3/189* | (2006.01) | |

(52) U.S. Cl.
CPC ........... *H04B 7/2041* (2013.01); *H04B 17/21* (2015.01); *H03F 2200/192* (2013.01)

(58) Field of Classification Search
USPC .............................................. 330/124 R, 295
See application file for complete search history.

(56) References Cited

U.S. PATENT DOCUMENTS

| | | | |
|---|---|---|---|
| 5,543,801 | A | 8/1996 | Sawyer |
| 5,886,573 | A | 3/1999 | Kolanek |
| 6,668,161 | B2 | 12/2003 | Boros et al. |
| 7,688,692 | B2 * | 3/2010 | Chen .................... G11B 7/0906 369/44.29 |
| 7,787,819 | B2 | 8/2010 | Walker et al. |
| 7,822,147 | B2 | 10/2010 | Huang et al. |
| 8,184,678 | B2 * | 5/2012 | McHenry ............. H03F 1/3229 375/219 |
| 8,618,878 | B2 | 12/2013 | Hangai et al. |
| 9,014,619 | B2 | 4/2015 | Benjamin et al. |
| 9,413,306 | B2 | 8/2016 | Moreau |
| 9,608,716 | B1 | 3/2017 | Elwailly et al. |
| 9,735,742 | B2 * | 8/2017 | Roukos .................... H03F 1/42 |
| 10,284,308 | B1 | 5/2019 | Elwailly et al. |
| 2004/0046695 | A1 | 3/2004 | Brothers, Jr. et al. |
| 2004/0061644 | A1 | 4/2004 | Lier et al. |
| 2005/0272392 | A1 | 12/2005 | Richardson |
| 2008/0051080 | A1 | 2/2008 | Walker et al. |
| 2008/0153433 | A1 | 6/2008 | Pallonen et al. |
| 2009/0153394 | A1 | 6/2009 | Navarro et al. |
| 2009/0298422 | A1 | 12/2009 | Conroy et al. |
| 2010/0090762 | A1 | 4/2010 | van Zelm et al. |
| 2010/0156528 | A1 | 6/2010 | Couchman et al. |
| 2010/0164782 | A1 | 7/2010 | Saha et al. |
| 2010/0177678 | A1 | 7/2010 | Sayegh |
| 2011/0201283 | A1 | 8/2011 | Lorenz et al. |
| 2011/0267141 | A1 | 11/2011 | Hangai et al. |
| 2012/0319771 | A1 | 12/2012 | Moon et al. |
| 2014/0354355 | A1 | 12/2014 | Moreau |
| 2014/0362896 | A1 | 12/2014 | Aymes et al. |
| 2016/0087713 | A1 | 3/2016 | Oderman et al. |
| 2017/0093539 | A1 | 3/2017 | Wang |
| 2017/0229765 | A1 | 8/2017 | Vaddiparty et al. |
| 2018/0019806 | A1 | 1/2018 | Buer et al. |
| 2018/0227043 | A1 | 8/2018 | Dankberg |
| 2019/0007129 | A1 | 1/2019 | Vargas et al. |

OTHER PUBLICATIONS

Restriction Requirement dated Apr. 25, 2018, U.S. Appl. No. 15/628,140, filed Jun. 20, 2017.
Response to Restriction Requirement dated Jun. 22, 2018, U.S. Appl. No. 15/628,140, filed Jun. 20, 2017.
Non-final Office Action dated Jul. 27, 2018, U.S. Appl. No. 15/628,140 filed Jun. 20, 2017.
Response to Office Action dated Oct. 24, 2018, U.S. Appl. No. 15/628,140, filed Jun. 20, 2017.
Final Office Action dated Dec. 11, 2018, U.S. Appl. No. 15/628,140, filed Jun. 20, 2017.
Response to Office Action dated Mar. 8, 2019, U.S. Appl. No. 15/628,140, filed Jun. 20, 2017.
Non-final Office Action dated Mar. 28, 2019, U.S. Appl. No. 15/628,140, filed Jun. 20, 2017.
U.S. Appl. No. 15/833,351, filed Dec. 6, 2017 by Grybos et al.
Notice of Allowance dated Mar. 12, 2019, U.S. Appl. No. 15/833,351, filed Dec. 6, 2017.
Notice of Allowance dated Jan. 17, 2019, U.S. Appl. No. 15/926,628, filed Mar. 20, 2018.
Post Allowance Amendment under 37 CFR 1.312 filed Jan. 18, 2019.
U.S. Appl. No. 15/926,186, filed Mar. 20, 2018.
Notice of Allowance dated Jan. 28, 2019, U.S. Appl. No. 15/926,186, filed Mar. 20, 2018.
Comparini, et al., Telecommunications Services by Satellite: Enabling Technologies and Examples, Alcatel, 2006, pp. 1-8, 2nd Quarter.
Morris et al., Airbus Defence and Space: Ku Band Multiport Amplifier power HTS Payloads into the furture, 33rd AIAA International Communications Satellite Systems Conference and Exhibition, Sep. 2015, pp. 1-13, Published by the American Institute of Aeronautics and Astronautics, Inc.
James et al., RF Modelling of a Multiport Amplifier for a Mobile Communications Satellite, pp. 1-12.
English translation of CN Publication No. 102394679B, published on Jul. 2, 2014, Google Patents translation downloaded May 4, 2017.
English Abstract of EP Publication No. 1532716 published on May 25, 2005.
Notice of Allowance dated Aug. 28, 2019, U.S. Appl. No. 15/628,140, filed Jun. 20, 2017.
Response to Office Action dated Jun. 27, 2019, U.S. Appl. No. 15/628,140, filed Jun. 20, 2017.

\* cited by examiner

MULTIPORT AMPLIFIER INPUT NETWORK WITH COMPENSATION FOR OUTPUT NETWORK GAIN AND PHASE FREQUENCY RESPONSE IMBALANCE

PRIORITY CLAIM

This application is a divisional of U.S. patent application Ser. No. 15/926,186, filed Mar. 20, 2018, published as US 2019/0173443 on Jun. 6, 2019 and issued as U.S. Pat. No. 10,320,349 on Jun. 11, 2019, and titled MULTIPORT AMPLIFIER INPUT NETWORK WITH COMPENSATION FOR OUTPUT NETWORK GAIN AND PHASE FREQUENCY RESPONSE IMBALANCE, which is a continuation-in-part (CIP) of and claims priority to commonly invented and commonly assigned U.S. patent application Ser. No. 15/833,351, filed Dec. 6, 2017, published as US 2019/0173545 on Jun. 6, 2019 and issued as U.S. Pat. No. 10,361,762 on Jul. 23, 2019, and titled CALIBRATION OF SATELLITE BEAMFORMING CHANNELS, both of which are incorporated herein by reference in their entirety.

BACKGROUND

In order to properly transmit signals to subscribers, a communication satellite needs to be accurately calibrated. Although a satellite may be initially well-calibrated, over time, and particularly in the harsh conditions of space, the calibration can drift, requiring recalibration. Beamforming satellites transmit a signal from several antennae that form a beam at chosen locations though constructive and destructive interference between the different signals. Beamforming satellites must be calibrated to a set of requirements that are tighter than those for a non-beamforming satellite as the gain, phase and delay must be accurately calibrated so that the different transmitted signals constructively interfere properly at the desired location.

DETAILED DESCRIPTION

Figure 1:
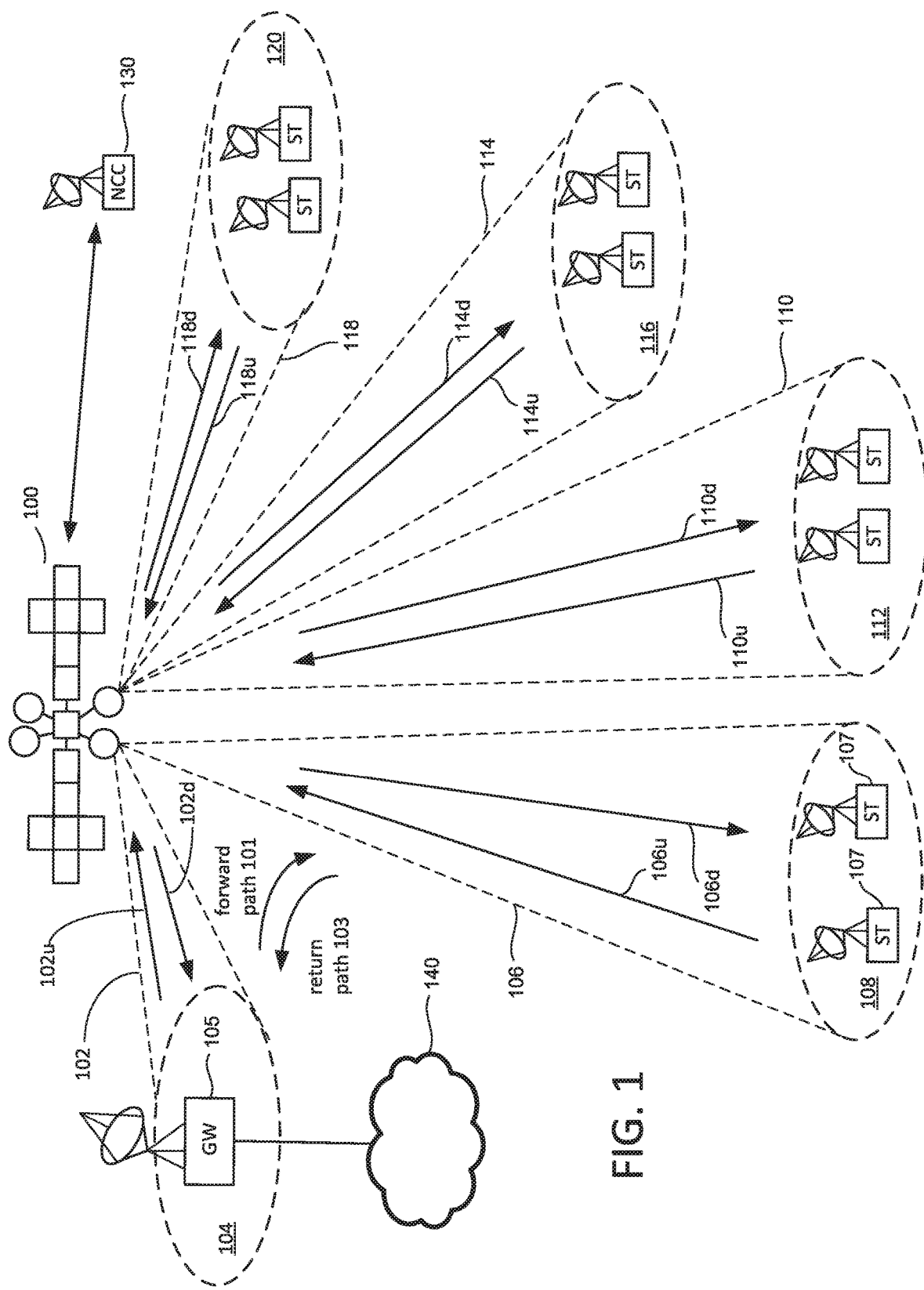
FIG. 1 is a block diagram describing a satellite communication system.

The following presents techniques allowing channels of a satellite to be calibrated while the channels are in active operation. A spread spectrum calibration signal is generated and injected into a channel of the satellite. The spread spectrum signal has a power level below the thermal noise floor of a customer or user signal active in the channel, allowing the calibration to be performed without disruption in service. After passing through a section of the channel, such as the receive or transmit portion, the calibration signal is de-spread and used to determine adjustments to calibrate the channel. Although the following is described primarily in the context of a beamforming system, due to the usually more stringent calibration requirements of such systems, the techniques can also be applied more generally to non-beamforming satellites and systems.

To further improve the calibration process, when the transmit side of the satellite includes an output hybrid matrix, the calibration of the transmit side can be performed in two steps. In a first step, the spread spectrum calibration signal is injected into the path at the input of an output hybrid matrix and used to calibrate this portion of the path. A second calibration step is then performed to correct for the whole of the channel's transmit path.

The efficiency of the calibration process can be improved by accounting for the power of the user signal in a channel. The lower the power of a channel's signal, the lower the signal to noise ratio for that channel, so that the lower the power of the user's signal in the channel, the less time is spent calibrating the channel. Consequently, rather than use a calibration time based on the worst case (i.e., highest) power that may be planned in an active channel, the calibration time in each can be based on the actual power level of the user signal in the channel.

To reduce circuit complexity and weight, rather than having the switching and multiplexing circuitry to inject and extract the spread spectrum calibration signal individually for each channel, a receive antenna probe can concurrently inject the calibration into multiple channels and a transmit antenna probe can concurrently extract the calibration signal from multiple channels.

To reduce the frequency with which such calibrations need to be performed, the signal paths can be calibrated based on relative path to path differences, rather than calibrating relative to some absolute base line. As beamforming requires that the different signals for the satellite have the proper amplitude, phase and delay relative to one another, if all of the signals have a common amount of drift for signals, they will still form a beam. Consequently, by using a path to path calibration, the channels will not need to be calibrated for common shifts in phase and other parameters.

The use of a spread spectrum calibration signal can also be applied to multiport amplifiers (MPAs) when used in a satellite or more generally to calibrate an MPA when in active operation. As in the beamforming device example, a spread spectrum calibration signal can be injected into the MPA and propagated through its different amplification paths. The propagated signals can then be compared to the original signal to determine adjustments to the phase, gain and other parameters to equalize the different paths relative to one another so as to form a well-defined output signal from an input signal. Many of the techniques used for the beamforming example can also be applied to MPA calibration.

FIG. 1 illustrate one embodiments in which these calibration methods can be applied and depicts a block diagram of a wireless communications system that includes a communication platform 100, which may be a satellite located, for example, at a geostationary or non-geostationary orbital location. In other embodiments, other platforms may be used such as UAV or balloon, or even a ship for submerged subscribers. In yet another embodiment, the subscribers may be air vehicles and the platform may be a ship or a truck where the "uplink" and "downlink" in the following paragraphs are reversed in geometric relations. Platform 100 may be communicatively coupled to at least one gateway 105 and a plurality of subscriber terminals ST (including subscriber terminals 107). The term subscriber terminals may be used to refer to a single subscriber terminal or multiple subscriber terminals. A subscriber terminal is adapted for communication with the wireless communication platform including as satellite 100. Subscriber terminals may include fixed and mobile subscriber terminals including, but not limited to, a cellular telephone, wireless handset, a wireless modem, a data transceiver, a paging or position determination receiver, or mobile radio-telephone, or a headend of an isolated local network. A subscriber terminal may be hand-held, portable (including vehicle-mounted installations for cars, trucks, boats, trains, planes, etc.) or fixed as desired. A subscriber terminal may be referred to as a wireless communication device, a mobile station, a mobile wireless unit, a user, a subscriber, or a mobile.

In one embodiment, satellite 100 comprises a bus (i.e. spacecraft) and one or more payloads (i.e. the communication payload). The satellite may also include multiple power sources, such as batteries, solar panels, and one or more propulsion systems, for operating the bus and the payload.

At least one gateway 105 may be coupled to a network 140 such as, for example, the Internet, terrestrial public switched telephone network, mobile telephone network, or a private server network, etc. Gateway 105 and the satellite (or platform) 100 communicate over a feeder beam 102, which has both a feeder uplink 102u and a feeder downlink 102d. In one embodiment, feeder beam 102 is a spot beam to illuminate a region 104 on the Earth's surface (or another surface). Gateway 105 is located in region 104 and communicates with satellite 100 via feeder beam 102. Although a single gateway is shown, some implementations will include many gateways, such as five, ten, or more. One embodiment includes only one gateway. Each gateway may utilize its own feeder beam, although more than one gateway can be positioned within a feeder beam. Note that the terms "feeder" beams and "service" beams are used for convenience. Both feeder beams and service beams are spot beams and the terms are not used in a manner to limit the function of any beam. In one embodiment, a gateway is located in the same spot beam as subscriber terminals.

Subscriber terminals ST and satellite 100 communicate over service beams; for example, FIG. 1 shows service beams 106, 110, 114 and 118 for illuminating regions 108, 112, 116 and 120, respectively. In many embodiments, the communication system will include more than four service beams (e.g., 60, 100, etc.). Each of the service beams have an uplink (106u, 110u, 114u, 118u) and a downlink (106d, 110d, 114d, 118d) for communication between subscriber terminals ST and satellite 100. Although FIG. 1 only shows two subscriber terminals within each region 108, 112, 116 and 120, a typical system may have thousands of subscriber terminals within each region.

In one embodiment, communication within the system of FIG. 1 follows a nominal roundtrip direction whereby data is received by gateway 105 from network 140 (e.g., the Internet) and transmitted over the forward path 101 to a set of subscriber terminals ST. In one example, communication over the forward path 101 comprises transmitting the data from gateway 105 to satellite 100 via uplink 102u of feeder beam 102, through a first signal path on satellite 100, and from satellite 100 to one or more subscriber terminals ST via downlink 106d of service beam 106. Although the above example mentions service beam 106, the example could have used other service beams.

Data can also be sent from the subscriber terminals ST over the return path 103 to gateway 105. In one example, communication over the return path comprises transmitting the data from a subscriber terminal (e.g., subscriber terminal 107 in service beam 106) to satellite 100 via uplink 106u of service beam 106, through a second signal path on satellite 100, and from satellite 100 to gateway 105 via downlink 102d of feeder beam 102. Although the above example uses service beam 106, the example could have used any service beam.

FIG. 1 also shows a Network Control Center 130, which includes an antenna and modem for communicating with satellite 100, as well as one or more processors and data storage units. Network Control Center 130 provides commands to control and operate satellite 100. Network Control Center 130 may also provide commands to any of the gateways and/or subscriber terminals.

In one embodiment, communication platform 100 implements the technology described above. In other embodiments, the technology described above is implemented on a different platform (e.g. on the ground or on a different type of satellite) in a different communication system.

The architecture of FIG. 1 is provided by way of example and not limitation. Embodiments of the disclosed technology may be practiced using numerous alternative implementations.

Figure 2A:
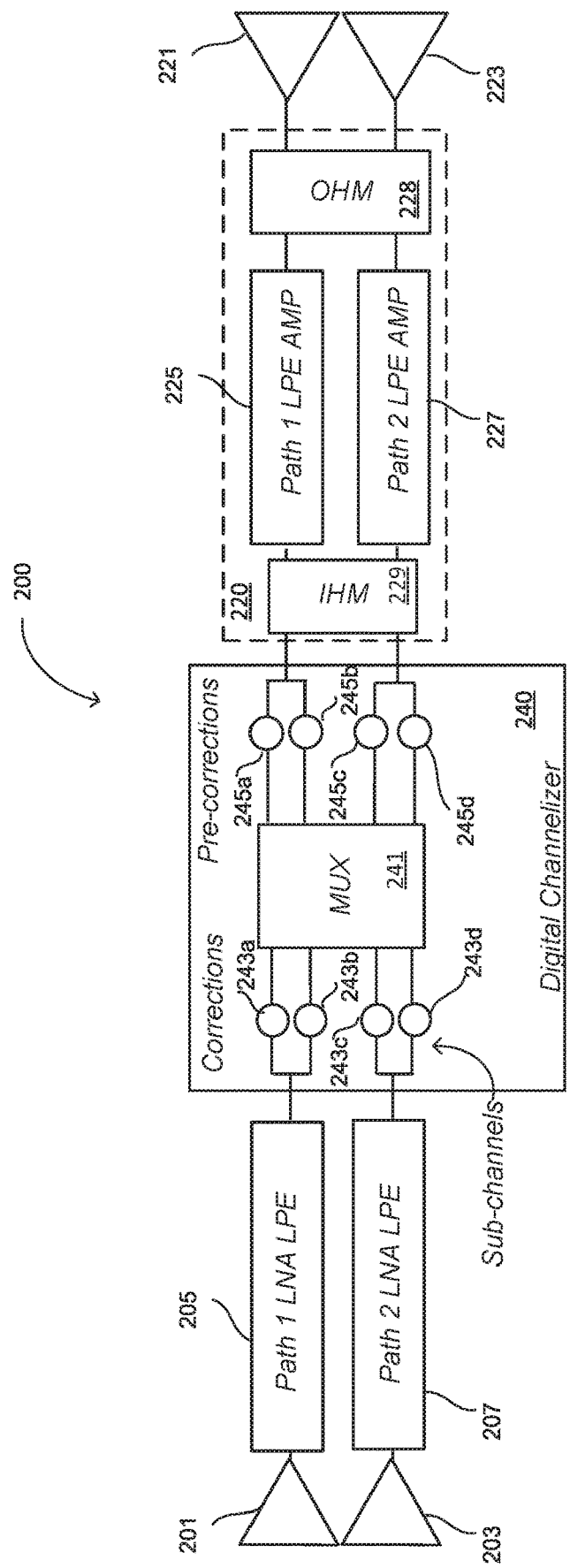
FIG. 2A is a block diagram of a satellite or other beamforming apparatus for an example of two input ports and two output ports.

FIG. 2A is a block diagram of a satellite or other beamforming apparatus for a simplified example of two input ports and two output ports, illustrating some of the elements that an embodiment of satellite 100 of FIG. 1 may include. Although FIG. 2 shows only two input ports and paths, and two output ports and paths for purposes of discussion, a real implementation of a satellite 100 as in FIG. 1 may have tens or even hundreds of such inputs, outputs and channels.

In this example, the receive side of the satellite 200 includes two antennae or other input ports 201, 203 each connected to a corresponding input path 205, 207. The input paths include low noise amplifiers (LNAs) and other low power equipment (LPE), such as mixers, amplifiers and filters used to process the received signals, which are then separated out into sub-channels, where the example shows two sub-channels per channel. These elements can introduce relatively large phase, delay and gain variations, such as can be caused by temperature variations. In a satellite application, when power consumption is a major consideration, use of low power elements is important, but in other applications where such constraints are less important, higher power components can be used. To account for gain, phase and other variations in each of the sub-channels on the receive side, a set of calibration correction elements 243a-d are included in the sub-channel receive paths. These can be adjusted to calibrate the individual sub-channels, such as would be done during an initial calibration process for the receive side.

On the transmit side, the two antennae or other output ports 221 and 223 are supplied signals from the output block 220. Output block 220 includes transmit path 1 circuitry 225 and transmit path 2 circuitry 227, which each include mixers, filters and amplifiers, including the high-powered amplifiers at the end, to generate the signals for the output ports 221 and 223. The transmit path 1 circuitry 225 and transmit path 2 circuitry 227 is connected to the output ports 221 and 223 through output hybrid matrix OHM 228 on the one side and to the input hybrid matrix IHM 229 on the input side. The input hybrid matrix IHM 229 allows for a signal from any one of the sub-channels to be distributed across multiple transmit paths, and the output hybrid matrix OHM 228 allows signals from any of the transmit paths to be directed to any of the output ports. Rather having all transmit paths be able to handle the maximum amplification power that may be needed in a single channel, the use of the input hybrid matrix IHM 229 and the input hybrid matrix IHM 229 allows for the signal of a sub-channel to be distributed across multiple transmit paths so that unused amplification power in underutilized channels is used to supply extra power for sub-channels needing higher degrees of amplification. This division of amplification allows for the individual transmit paths to use amplifiers of lower power, and consequently less cost and lower weight, which is an important concern in a satellite. A set of calibration pre-correction elements 245a-d are included in the sub-channel paths are included to account for gain, phase and other variations in each of the transmit sub-channels on the transmit side. These can be adjusted to calibrate the individual transmit sub-channels, such as would be done during an initial calibration process for the receive side.

A digital channelizer section 240 connects the receive side and the transmit side. In addition to the correction elements 243a-d for the receive sub-channels and the pre-correction elements 245a-d for the transmit sub-channels, multiplexing circuitry MUX 241 selectively connects the receive sub-channels and the transmit sub-channels.

Figure 2B:
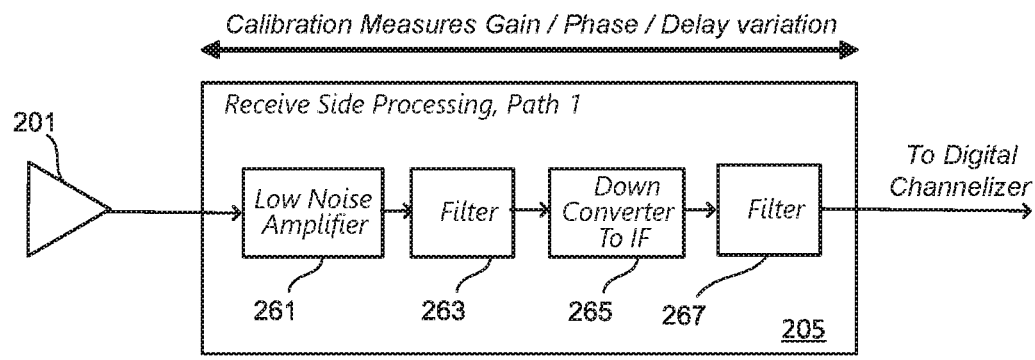
FIGS. 2B and 2C provide more detail on the receive paths and transmit paths of FIG. 2A.
Figure 2C:
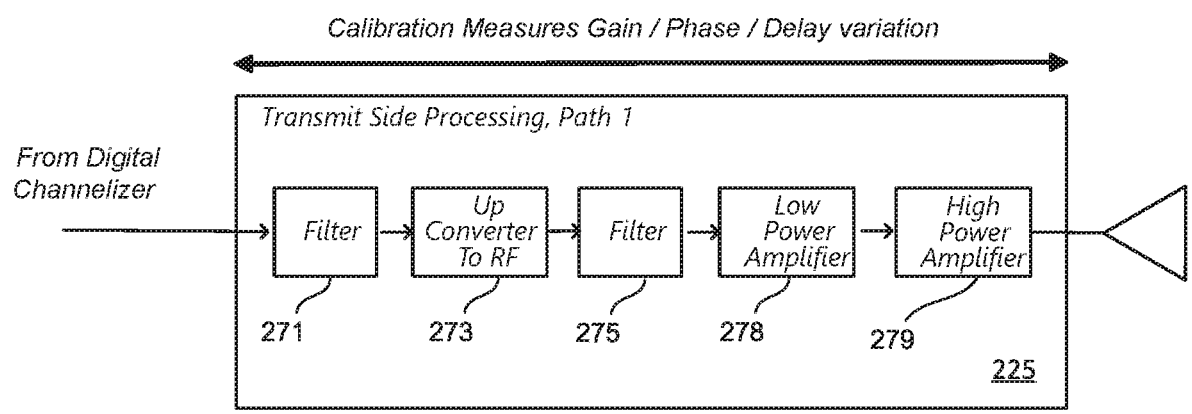

FIGS. 2B and 2C provide more detail on the receive paths and transmit paths of FIG. 2A. FIG. 2B is block diagram illustrating an embodiment of a receive path block, such as 205 or 207 in FIG. 2A, in more detail. More specifically, FIG. 2B provides more detail on some of the elements of one embodiment of receive path 1 205, where other receive paths would have a similar structure. The signal from the input port, such as an antenna 201, is initially received at a low noise amplifier 261. The amplified input signal is then filtered at block 263, down-converted from the received RF range to an intermediate frequency at block at block 265, before being filtered again at block 267. The signal is then sent on to the digital processing elements of the channelizer section 240 and separated out into sub-channels. The calibration process will allow the gain, phase and delay variations across the receive path to be determined.

FIG. 2C provides more detail on some of the elements of one embodiment of the transmit path 1 225 as connected between the input hybrid matrix IHM 229 and the output hybrid matrix 228, where other transmit paths would have a similar structure. The signal from the input hybrid matrix IHM 229 is filtered at block 271 and then up-converted from the IF range to the RF range in block 273, before being filtered again at block 275. The filtered and up-converted signals are then amplified initially by a low power amplifier 278 and then a high-power amplifier 279, before going on to the output hybrid matrix OHM 228. The input hybrid matrix IHM 229 and output hybrid matrix OHM 228 allow for different signals to be distributed across multiple high-power amplifiers from different paths to provide higher amounts of power for a signal than available from a single path, but without the need to have each path to be able to the worst case maximum amplification all by itself.

As noted above, the satellite 200 includes a set of calibration correction elements 243a-d in the sub-channel receive paths and calibration pre-correction elements 245a-d for the sub-channel transmit paths. These can be used for an initial calibration process prior to the satellite being put into service. However, once the satellite is in service, a channel's calibration traditionally cannot be updated while in use without disruption of any active user signals. Freeing up paths or sub-channels to allow measurement of gain, phase, delay or other values for calibration is not practical during active operation of the satellite payload. The following describes the use of spread spectrum calibration waveforms with power levels below the noise floor of the active signals, allowing calibration to be performed during active operation of the payload.

Although more generally applicable, the techniques described here are particularly useful for beamforming satellites, since in order to form a beam these are calibrated to a set of requirements that are tighter that those for a non-beamforming satellite. Having methods that measure gain, phase, and delay stability in an effective manner combine to reduce complexity and cost, allowing the payload hardware specification of gain, phase and delay stability to be more relaxed. The embodiments primarily described below allow the receive paths and the transmit paths to be individually calibrated. They also allow the simultaneous calibration of the transmit paths before and after an output hybrid matrix and can be done in a time effective manner for satellites with many channels.

Making periodic calibrations during the active operation of channels can help allow the payload hardware specification of gain, phase and delay stability to be more relaxed (for example, relaxing the gain variation specification from 0.2 dB to 10 dB for path to path differences), which can lead to saving in cost. Embodiments described here use a spread spectrum calibration signal generated from a pseudo-random noise sequence that can reside, for example, in a 1 MHz sub channel and set to a power level below the thermal noise floor (such as 17 dB below) at the input to the receive antenna elements to calibrate the receive path or at the input to the transmit paths to calibrate the transmit path. The pseudo random code known by the source and the receiver and used to recover the calibration signal information from an active channel signal. The calibration signal is a DC signal and the pseudo random code's spectrum (bandwidth) is wider than the calibration signal's Information bandwidth. The calibration signal can be injected into the signal path any time a measurement is desired, without interference to user signals. After passing through a particular receive or transmit path, the signal is de-spread, raising it above the other signal energy in the sub channel, where it is detected and measurements can be made to determine adjustments to be used in the calibration.

Figure 3:
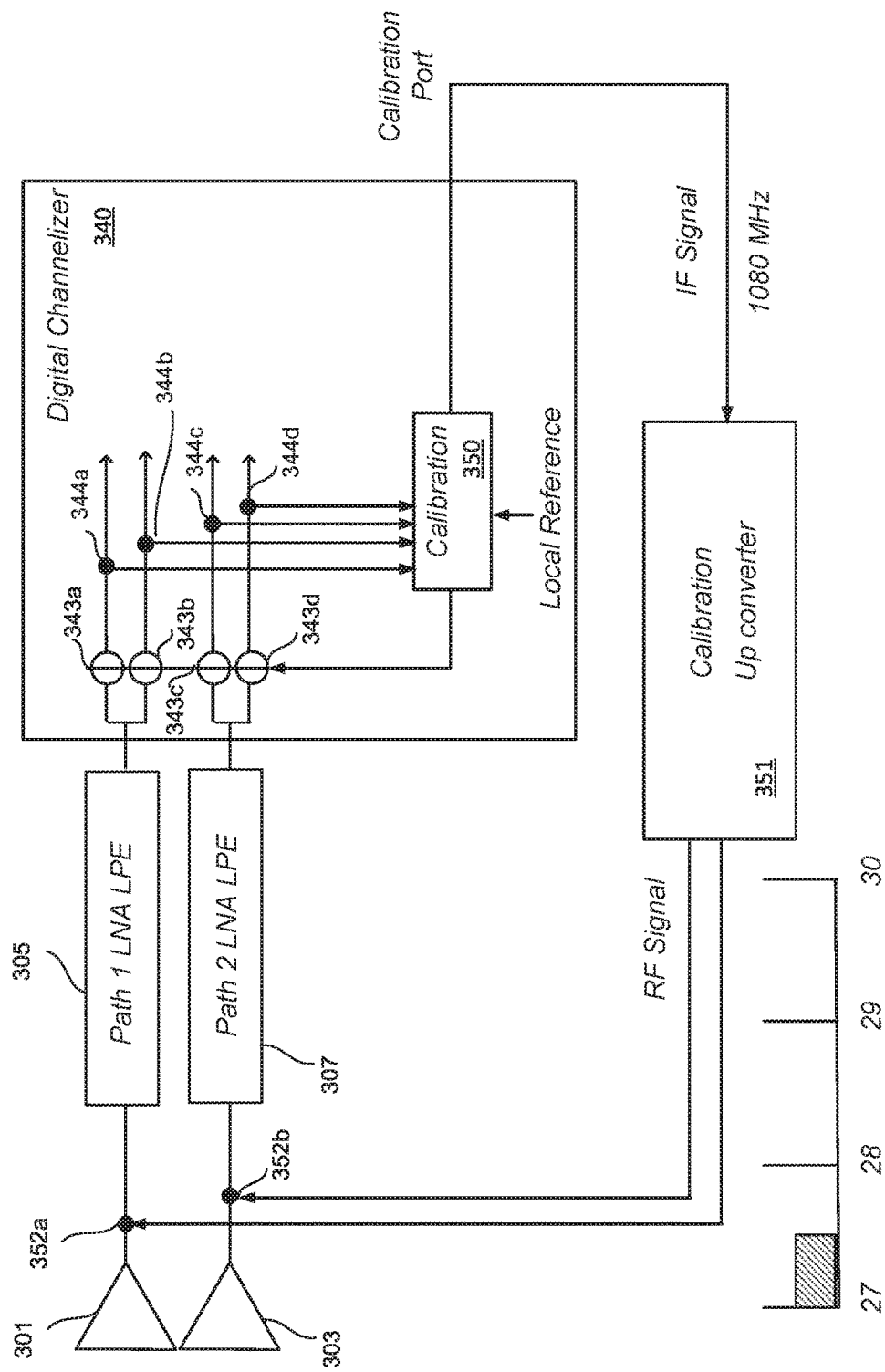
FIG. 3 illustrates an embodiment of the receive side circuitry incorporating the spread spectrum calibration elements.

FIG. 3 illustrates an embodiment of the receive side circuitry incorporating the spread spectrum calibration elements, repeating the receive side elements of FIG. 2 and adding calibration elements. More specifically, the receive side of the satellite includes two antennae or other input ports 301, 303 each connected to a corresponding input path 305, 307. A set of calibration correction elements 343a-d are included in the sub-channel receive paths.

A calibration block 350 is connected to receive a local reference signal, from which it generates a calibration signal. In this embodiment, the calibration signal is a low power spread spectrum signal formed from pseudo-random noise at an intermediate frequency of 1080 MHz. A calibration up-converter block 351 up-coverts the calibration signal up to the RF range of, in this example, 27-30 GHz. The up-converter block 351 can also include filters and amplifiers to increase the gain, according to the embodiment. A calibration injection ports 352a and 352b allow the calibration signal to be selectively injected at the start of path 1 305 and path 2 307, respectively. Multiplying the received signal (combination of the active channel plus the calibration signal) by a local version of the pseudo random code reduces the calibration signal bandwidth (which is the pseudo random code bandwidth, i.e. a wideband signal) to the calibration signal's information bandwidth (narrowband). Multiplying the received signal (combination of the active channel plus the calibration signal) by a local version of the pseudo random code increases the active channel bandwidth by the calibration signal's bandwidth. After propagating though a selected path and sub-channel, the injected calibration signal is extracted at extraction ports 344a-d and received back at the calibration block, where it can be de-spread and compared with the original signal. Based on the comparison, update corrections can be determined and supplied to the calibration correction elements 343a-d. Depending on the embodiment, based on the comparison the corrections can be determined on the satellite, on the ground, or some combination of these. In FIG. 3, the calibration can be between sub channels in the channelizer 340. This is because calibration will not only measure variation between paths, but also variation between sub channels. In effect this is measuring variation across frequency and will be used for equalization across frequency when needed.

Using correlation, the pseudo random code spread active channel signal can separated from the calibration signal's information. The embodiments presented here use coding to recover the calibration signal from the active channel signal, rather than using frequency filtering to isolate the calibration signal from the active channel signal. Both the calibration block 350 and up-converter 351 can be implemented as various combinations of one or more of hardware, software and firmware, depending on the embodiment. In the illustrated embodiment, the same calibration block is used for both receive side calibration and transmit side calibration (FIG. 6, below), but in other embodiments the transmit side can have separate calibration elements from the receive side. Additionally, although shown as part of the digital channelizer block 340 in the shown embodiments, more generally part or all of the calibration block elements can be incorporated into other parts of the satellite.

Figure 4:
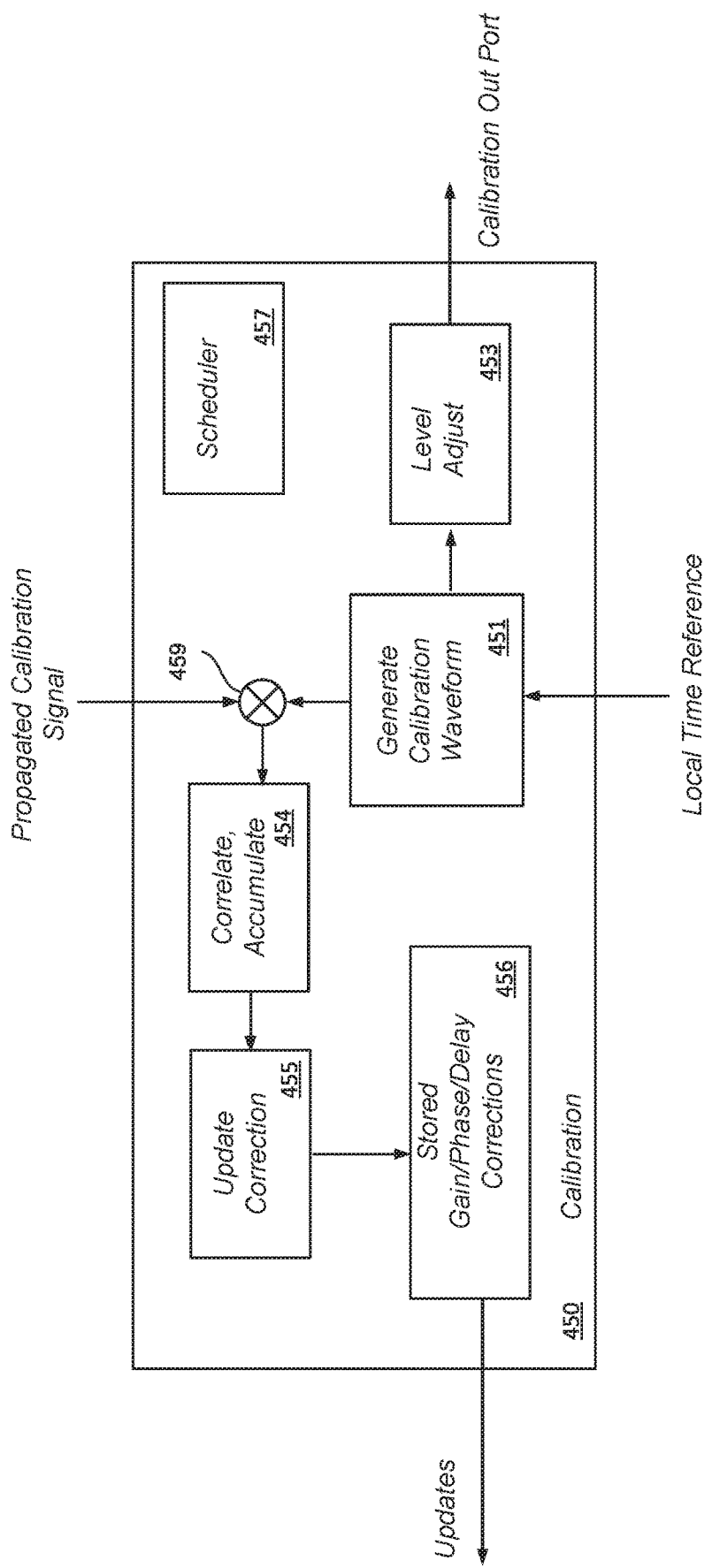
FIG. 4 is a block diagram for one embodiment of a calibration block.

FIG. 4 is a block diagram for one embodiment of a calibration block 450, such as can be used for calibration block 350 in FIG. 3 or calibration block 650 in FIG. 6 below. Block 451 receives a local time reference and from this generates the spread spectrum calibration signal, which then has its power level adjusted at block 453, providing the spread signal, low power calibration signal for injection. For the receive path, this signal is first up-converted, as illustrated in FIG. 3. After propagating through a portion of the circuitry, the calibration signal is then received at the multiplier 459, where it is combined with the original calibration waveform, the result going to the correlation/accumulation block 454. From the correlated, accumulated values, update corrections are then determined at block 455. The correction values can be used to determine gain/phase/delay values based on stored values, such as a look up table, at block 456, which are in turn used to update the calibrations for the sub-channels. The scheduler 457 determines which sub-channel is to be calibrated and when.

Figure 5:
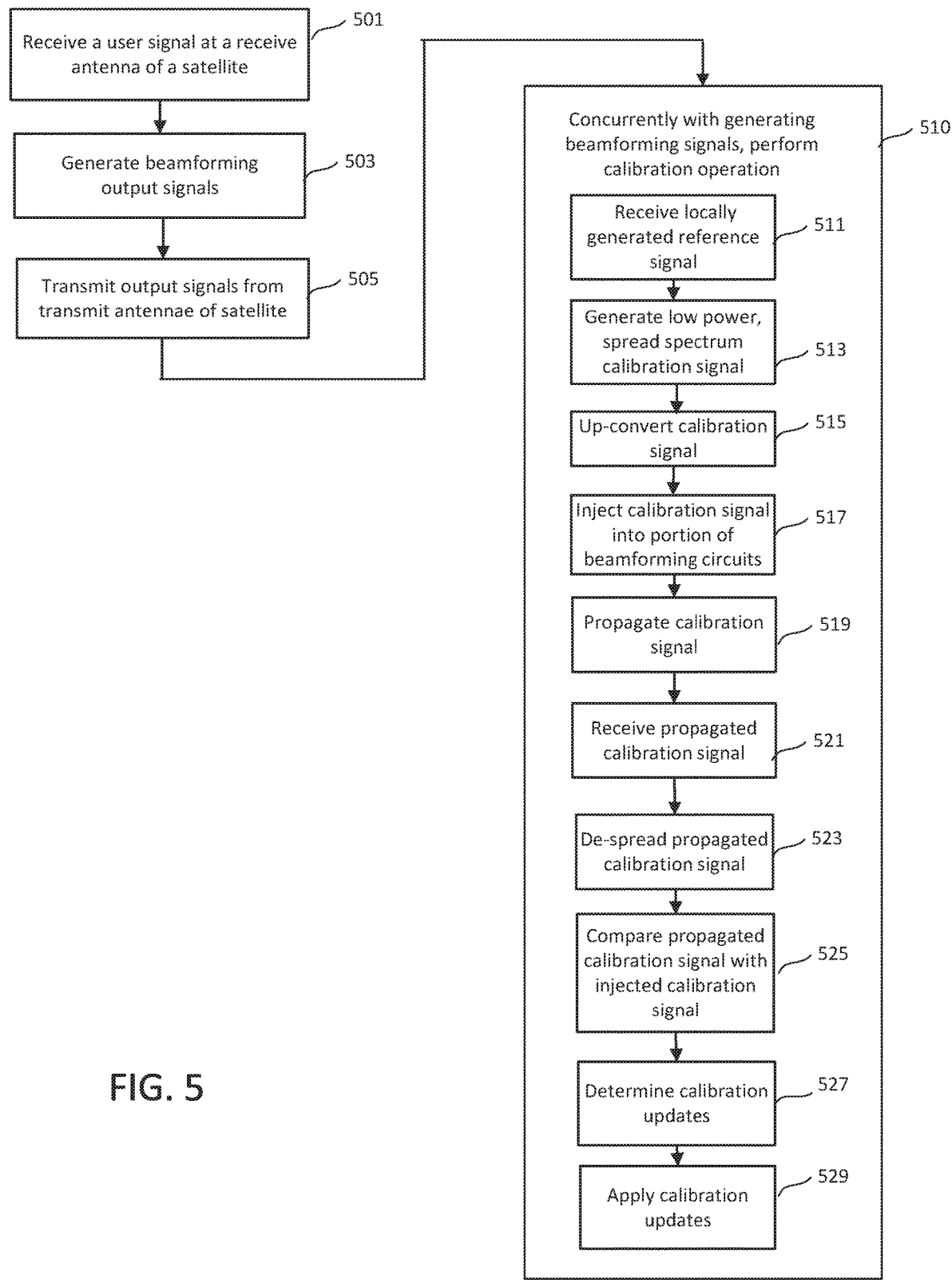
FIG. 5 is a flow chart illustrating one embodiment for a receive side calibration operation using a spread spectrum, low power calibration signal.

FIG. 5 is a flow chart illustrating one embodiment for a receive side calibration operation using a spread spectrum, low power calibration signal as described with respect to FIGS. 3 and 4. The use of the spread spectrum, low power calibration signal allows for a calibration operation to be performed on an active channel, although the calibration operation can also be performed when a channel is otherwise not active, such as part of a test mode. FIG. 5 describes a receive side calibration operation in an active path. At step 501, the satellite receives a user signal at an antenna and, from this received signal, generates one or more corresponding output signals at step 503. In the beamforming example, multiple output signals are formed so that a beam is formed when these are transmitted from corresponding multiple transmit antennae. At step 505, the output signals are transmitted. Step 510 is the calibration process and can be performed concurrently with the generating of the output signals by the beamforming circuitry at step 503.

The flow for the calibration operation of step 510 begins at step 511 with a locally generated reference signal, such as a pseudo-random noise signal generated on the satellite. At step 513 the spread spectrum calibration signal is then generated from the pseudo-random noise sequence and in one embodiment can reside in a 1 MHz sub channel and set to a power level below the thermal noise floor (such as 17 dB below) of the user signals in the channel. At step 515 the calibration signal is up-converted into, for example the 27-30 GHz range and, at step 517, injected into a selected receive path or portion of a receive path. The calibration for different paths and sub-channels can be performed sequentially according to a schedule based on how quickly the calibration of the different channels are found to drift. The injected calibration signal is then propagated through selected sub-channels of the receive side of the beamforming circuitry at step 519. Although the main embodiments presented here calibrate receive side and transmit side separately, alternate embodiments can calibrate the combined receive and transmit paths in a single process or, conversely, further divide up the circuitry in to smaller sections for calibration.

After the injected signal propagate the selected path, it is received back at the calibration block at step 521 and de-spread at step 523. The de-spread signal can then be compared to the original reference signal at step 525 and, based on the comparison the updates needed for the calibration values of the sub-channel can be determined at step 527. Depending on the embodiment, the determination of the update corrections can be performed by processing circuitry on the satellite; determined on the ground based on the results of the comparison sent by the satellite, with the results then returned to the satellite; or a combination of these. It should again be noted that although embodiments shown in the figures here show only two paths, in an actual satellite the number of channels can run into the tens or even hundreds. The update corrections are then applied to the calibration correction elements 343*a-d* of the sub-paths at step 529.

The calibration of delay, phase and gain values can be made relative to fixed normative values or, as discussed more below with respect to FIG. 13, based on the differential variation in delay, gain, and phase between paths 1 and 2. Except for the RF probe introduced below with respect to FIG. 11, the calibration loop is common mode and will not vary between the times it takes to measure the different paths in the front end. A comparison of the signal through the loop and along each of the front-end paths against a local reference allows the system to estimate the difference between any two paths and hence calibrate it out.

In the calibration process, the phase adjustment to each path can be made after the comparison to the local reference. A timing adjustment can be performed first, after which a residual delay may remain. The phase of each path can be measured relative to the local reference such that paths are coherent at radio frequencies. The local reference can be adjusted to minimize the largest required correction across all paths. The gain adjustment of each path can be to a local nominal value, which can slowly adjust to minimize the largest required correction across all paths.

Looking now at the transmit side calibration, the transmit side calibration is concerned with measuring the variations in delay, gain, and phase in transmit path 1 circuitry 225 and transmit path 2 circuitry 227 of FIG. 2A, as well as in the input hybrid matrix IHM 229 and output hybrid matrix OHM 228. As with the receive side, the rest of the calibration loop is common mode or measured beforehand and accounted for in the calibration. One difference from the receive side is the existence of the hybrid matrices IHM 229 and OHM 228. As these mix signals from multiple paths, these can have their own gain/phase matching problems. As discussed further below with respect to FIG. 8, in some embodiments the transmit side calibration can be done in two steps to account for these elements.

Figure 6:
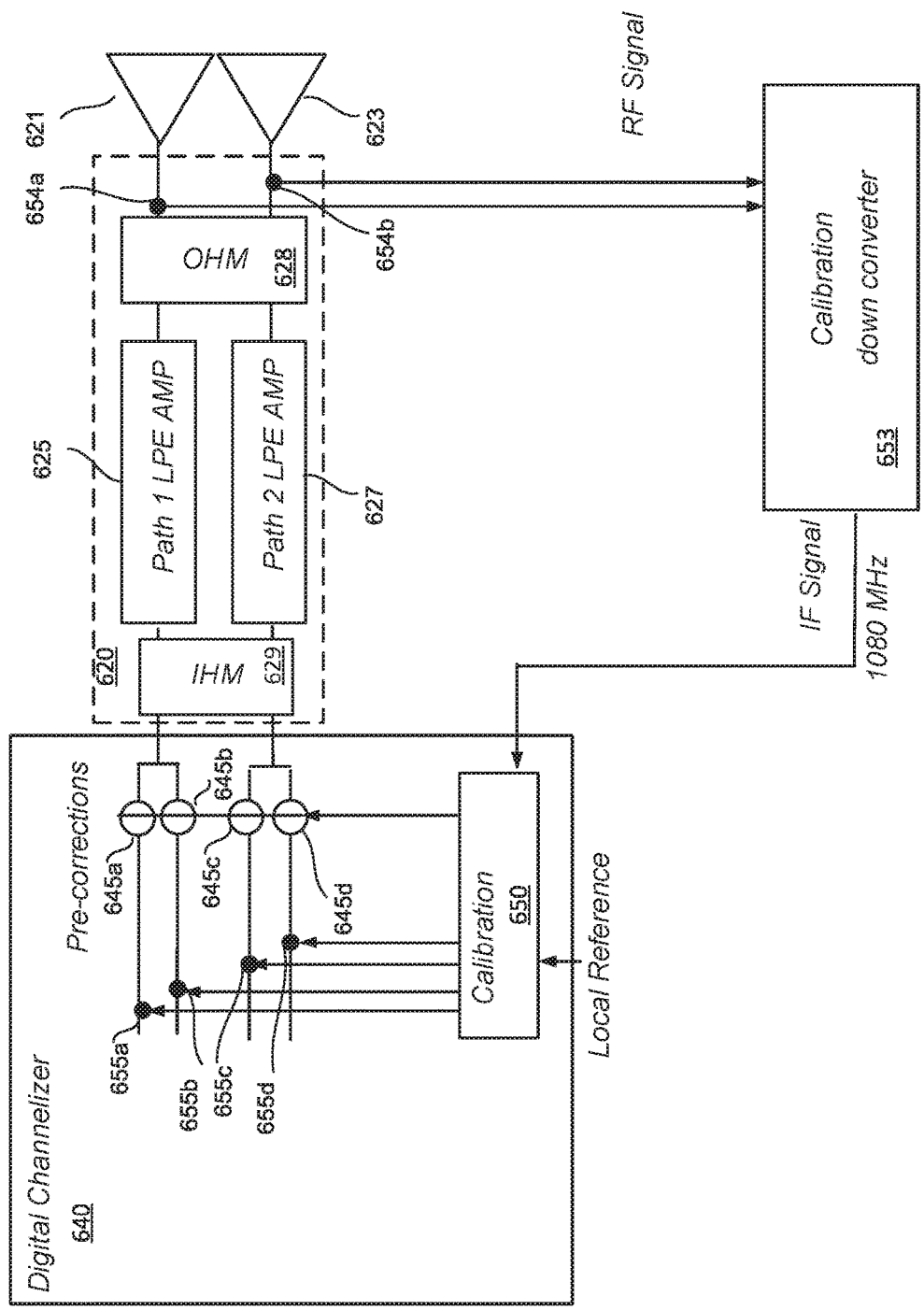
FIG. 6 illustrates an embodiment of the transmit side circuitry incorporating the spread spectrum calibration elements.

FIG. 6 illustrates an embodiment of the transmit side circuitry incorporating the spread spectrum calibration elements, repeating the transmit side elements of FIG. 2 and adding calibration elements. More specifically, the transmit side of the satellite includes two antennae or output ports 621 and 623 each connected to a corresponding transmit path 625, 627 through the output hybrid matrix OHM 628. A set calibration pre-correction elements 645*a-d* are included at the start of the sub-channel transmit paths. Signals from the sub-channels in the digital channelizer section 640 connected to the transmit paths 625 and 627 by the input hybrid matrix IHM 629.

The calibration block 650 is connected to receive a local reference signal, from which it generates a calibration signal. As with the receive side embodiments described with respect to FIGS. 3-5, in this embodiment, the calibration block 650 generates a calibration signal that is a low power, spread spectrum signal formed from pseudo-random noise. In the embodiment illustrated in FIG. 6, the calibration signal is injected at injection ports 655*a-d* into selected sub-channels before the pre-correction elements 645*a-d* and extracted at before the output ports 621 and 623 at the calibration extraction ports 654*a* and 654*b*. In other embodiments, the calibration signal can be injected, extracted or both at other points in order calibrate smaller divisions of the transmit circuitry. A calibration down-converter 653 down-converts the extracted RF frequency calibration signal to an intermediate frequency (1080 MHz in this example) and returns it to the calibration block 650, where it can be de-spread and compared with the original signal. Based on the comparison, update corrections can be determined and supplied to the pre-calibration correction elements 645*a-d*. The determination of the pre-correction updates from the comparisons can performed on the satellite, on the ground, or a mixture of these.

Figure 7:
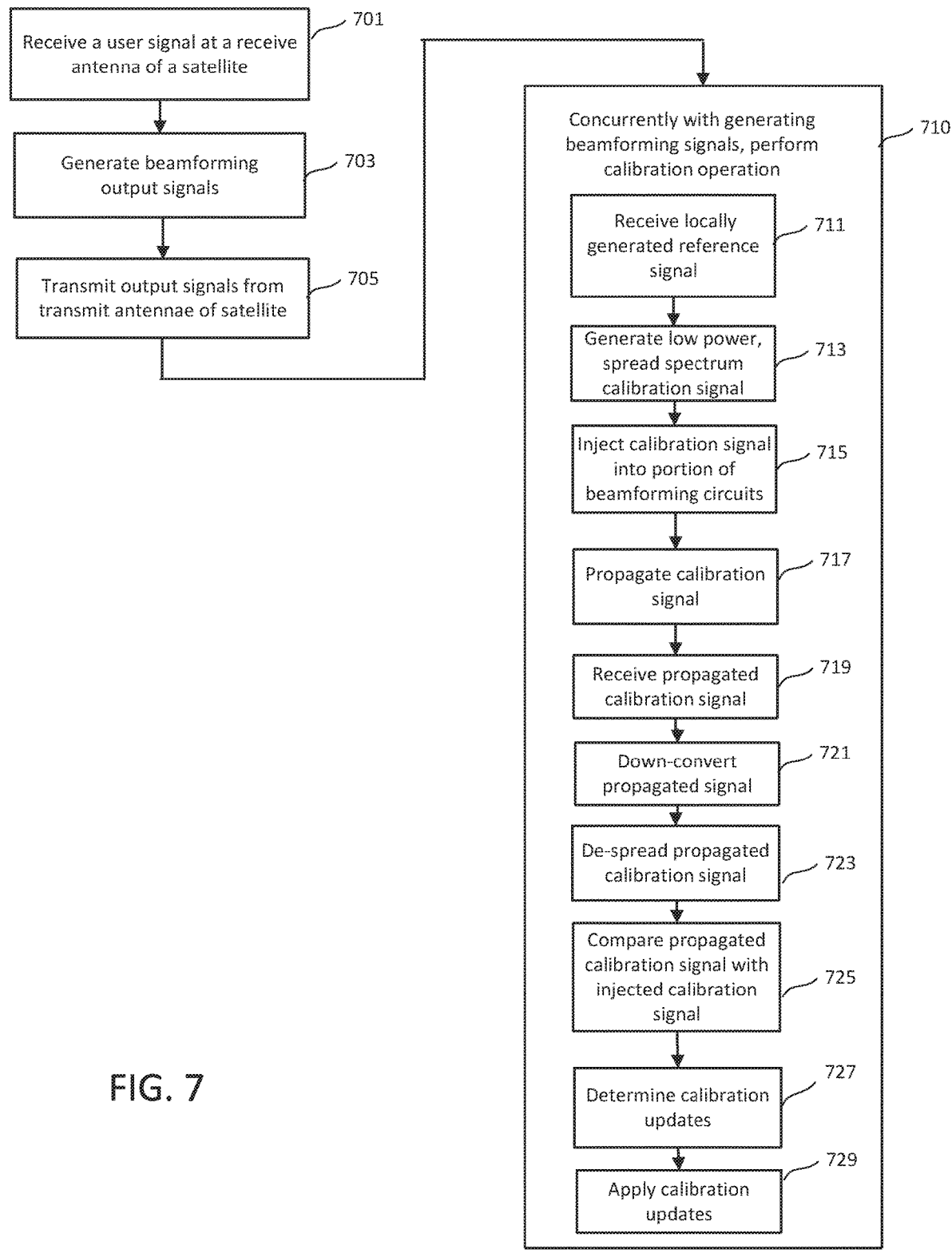
FIG. 7 is a flow chart illustrating one embodiment for a transmit side calibration operation using a spread spectrum, low power calibration signal.

FIG. 7 is a flow chart illustrating one embodiment for a transmit side calibration operation using a spread spectrum, low power calibration signal as described with respect to FIG. 6. The use of the spread spectrum, low power calibration signal allows for a calibration operation to be performed on an active channel, although the calibration operation can also be performed when a channel is otherwise not active, such as part of a test mode. FIG. 7 describes a receive side calibration operation in an active path. At step 701, the satellite receives a user signal at an antenna and, from this received signal, generates one or more corresponding output signals at step 703. In the beamforming example, multiple output signals are formed so that a beam is formed when these are transmitted from corresponding multiple transmit antennae. At step 705, the output signals are transmitted. Step 710 is the calibration process and can be performed concurrently with the generating of the output signals by the beamforming circuitry at step 703.

The flow for the calibration operation of step 710 begins at step 711 with a locally generated reference signal, such as a pseudo-random noise signal generated on the satellite. At step 713 the spread spectrum calibration signal is generated from the pseudo-random noise sequence and in one embodiment can reside in a 1 MHz sub channel and set to a power level below the thermal noise floor (such as 17 dB below) of the user signals in channel. At step 715 the calibration signal is injected into a selected transmit path sub-channel. The calibration for different paths and sub-channels can be performed sequentially according to a schedule based on how quickly the calibration of the different channels are found to drift. The injected calibration signal is then propagated through selected sub-channels of the transmit side of the beamforming circuitry at step 717. Although the main embodiments presented here calibrate receive side and transmit side separately, alternate embodiments can calibrate the combined receive and transmit paths in a single process or, conversely, further divide up the circuitry in to smaller sections for calibration.

After the injected signal propagates through the selected path, it is extracted and down-converted at step 719, received back at the calibration block at step 721 and de-spread at step 723. The de-spread signal can then be compared to the original reference signal at step 725 and, based on the comparison the updates needed for the pre-calibration values of the sub-channel can be determined at step 727. Depending on the embodiment, the determination of the update corrections can be performed by processing circuitry on the satellite; determined on the ground based on the results of the comparison sent by the satellite, with the results then returned to the satellite; or a combination of these. It should again be noted that although embodiments shown in the figures here show only two paths, in an actual satellite the number of channels can run into the tens or even hundreds. The update corrections are then applied to the calibration correction elements 645a-d of the sub-paths at step 729.

In FIG. 6, the calibration signal is injected before the input hybrid matrix IHM 629 and extracted after the output hybrid matrix OHM 628, so that phase, gain and delay errors can be introduced in any of these elements, as well as in any amplifiers or other elements in the transmit paths 625 and 627. Consequently, these transmit side differs from the from the receive side due to the complication of the hybrid matrices IHM 229 and OHM 228.

Figure 8:
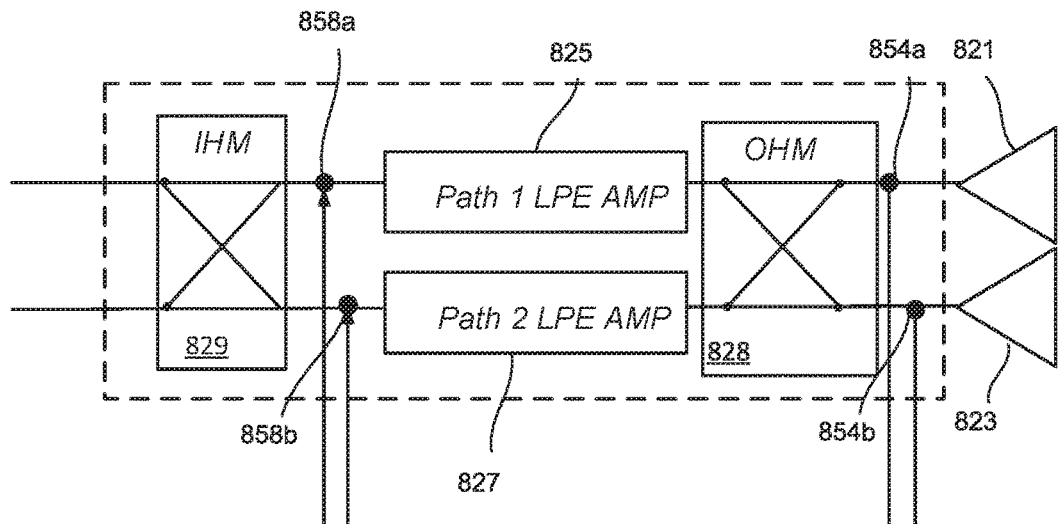
FIG. 8 is a schematic representation of a portion of the transmit section of FIG. 6 to illustrate the mixing of channels.

FIG. 8 is a schematic representation of this portion of the transmit section of FIG. 6 to illustrate the mixing of channels. As shown at left, both channels are input into the input hybrid matrix IHM 829, which allows the signal from either channel to be distributed across both of transmit track path 1 825 and transmit path 2 827, so that the amplifiers in both paths can be used for a given signal. The output hybrid matrix OHM 828 allows the output from either, or both, of transmit path 1 825 and transmit path 2 827 to be directed to either of the output ports 821 and 823. As these hybrid matrices mix signals from multiple paths, these elements can have their own gain and phase matching problems. To account for this, in some embodiments the transmit side calibration can be done in multiple steps.

For example, in a first calibration phase, the calibration signal can be injected at the injection ports 858a and 858b, before the output hybrid matrix OHM 828 and the circuitry of the transmit paths 825 and 827, but after the input hybrid matrix IHM 829. If the multiplexing circuitry of the output hybrid matrix OHM 828 is balanced, there will be a known gain at the calibration extraction ports 854a and 854b. After updating the calibration for these elements, the calibration for the whole of the transmit side can be performed assuming that the output hybrid matrix OHM 828 introduces no error. The process of measuring the calibration parameters for the output hybrid matrix and then correcting for the full path can be iterated if desired to increase the calibration accuracy.

Figure 9:
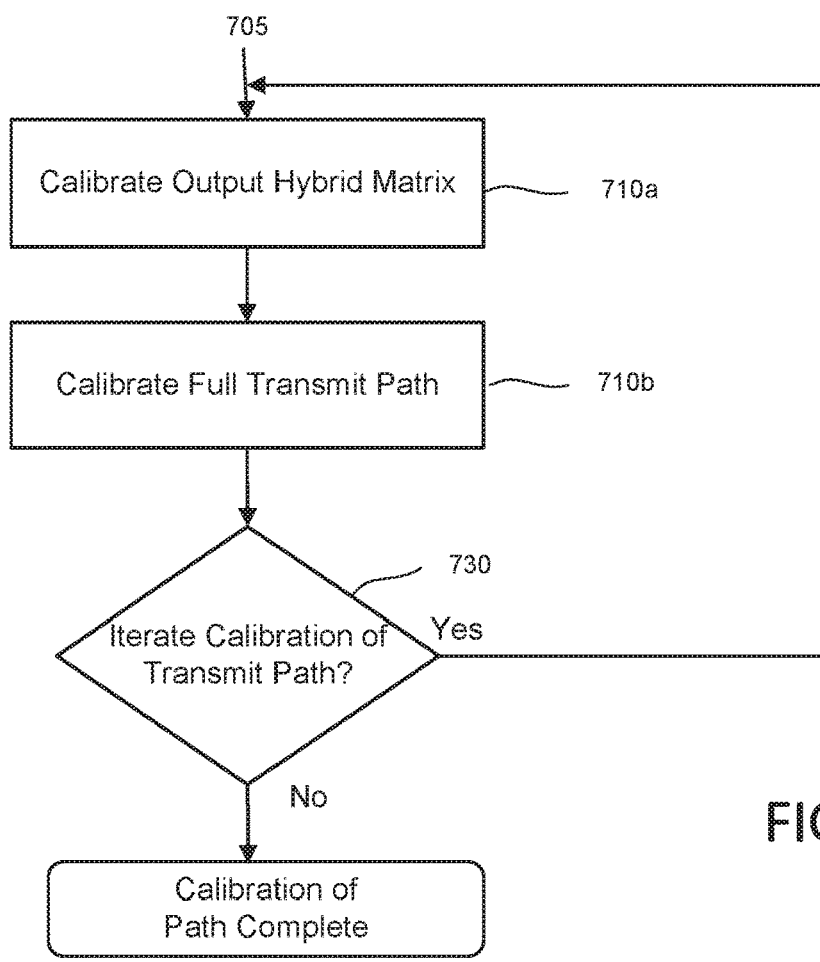
FIG. 9 is a flow chart illustrating one embodiment for incorporating a two-step calibration process into the transmit side flow of FIG. 5.

FIG. 9 is a flow chart illustrating one embodiment for incorporating a two-step calibration process into the transmit side flow of FIG. 7, where an initial calibration is done for a hybrid matrix element followed by a full transmit side calibration. Referring back to FIG. 7, after step 705, the transmit path of FIG. 6 is calibrated at step 710, where the calibration signal is injected before the input hybrid matrix IHM 629 of FIG. 6 and extracted after the output hybrid matrix OHM 628. In FIG. 9, the calibration step 710 is performed twice, a first time at step 710a where the calibration signal is injected at a selected one of 858a and 858b, with steps 711-729 performed for the output hybrid matrix 828 section and the circuitry of the transmit paths 825 and 827. Step 710b is then performed a second time, performing steps 711-729 for the whole of the transmit path. If higher accuracy is wanted, the process can be iterated by looping back at step 730 to repeat step 710a.

To simplify the discussion, the examples illustrated here have been using only two receive paths and two transmit paths, but an actual satellite may have tens or even hundreds of such paths. Consequently, even if a calibration operation of a signal sub-channel or path does not require an overly large amount of time, measuring the gain, phase and delay for all or most paths and frequencies to the required accuracies for beamforming can be time consuming.

The amount of time required to accurately measure the amount of error in a sub-channel depends on the signal to noise ratio (S/N) for the user signal active in a path. To be able to accurately measure the error in a path for all power levels with a fixed integration or dwell time would require that all measurements assume the highest power level that may be used in a channel. However, by reducing the dwell time for each measurement based on the actual power level in each path/sub channel, the system can reduce the load on the circuitry and processing by large factors (such as 10-100 based on maximum to minimum user power level in each sub channel).

Each path/sub channel has a power level estimate associated with it, based on the user signal active in it. The lower the power of the signal, the lower the S/N value. The dwell time for measurement for determining the error in a path can be made a function of the power, with less time spend on lower power sub-channels and only the most powerful signals requiring the maximum dwell. As one of the measurements made in the calibration process is gain, this can be used to update the power level estimate associated with the path/sub channel, which in turn can be used to determine a dwell time.

Figure 10:
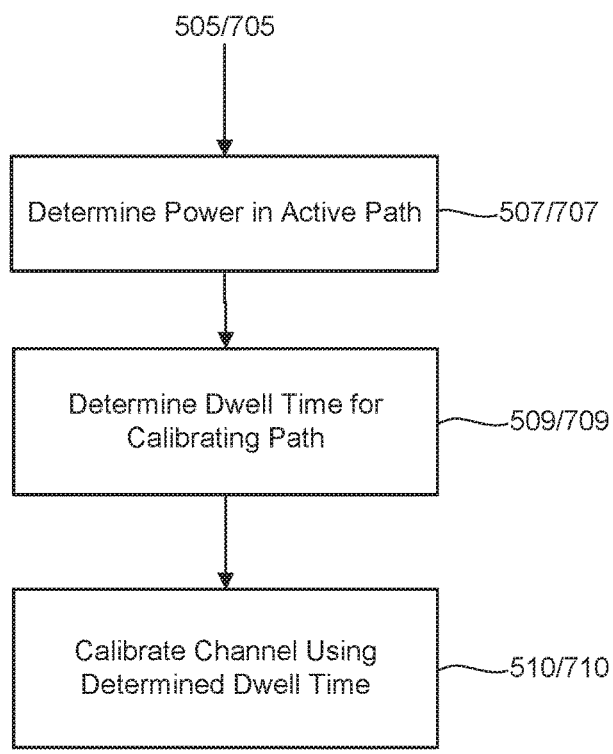
FIG. 10 is a flow chart illustrating one embodiment for basing the calibration dwell time on the power level in a sub-channel.

FIG. 10 is a flow chart illustrating one embodiment for basing the calibration dwell time on the power level in a sub-channel. For a given sub-channel, the dwell time determination can be inserted between steps 505 and 510 for a receive side calibration and between steps 705 and 710. At step 507/707, the power of the user signal active in the sub-channel at step 503/703 is determined. Based on this power level, the dwell time for the calibration is determined at step 509/709, after which the calibration is performed at step 510/710 using this dwell time.

As illustrated in the embodiment of FIG. 3, the calibration signal is injected into the different paths through the calibration injection ports 352a and 352b. Similarly, in the embodiment of FIG. 6, the calibration signals are extracted at the calibration extraction ports 654a and 654b. Introducing the switching and taps for the calibration injection ports in the receive paths and calibration extraction ports in the transmit paths of a beamforming satellite to inject and retrieve calibration signals is expensive in complexity and weight of the payload as actual satellites can have large numbers of such paths. Using a transmit probe to inject power into all elements of the receive antenna and a receive probe to collect power from all elements of the transmit antenna can be much simpler and have lower weight.

Figure 11:
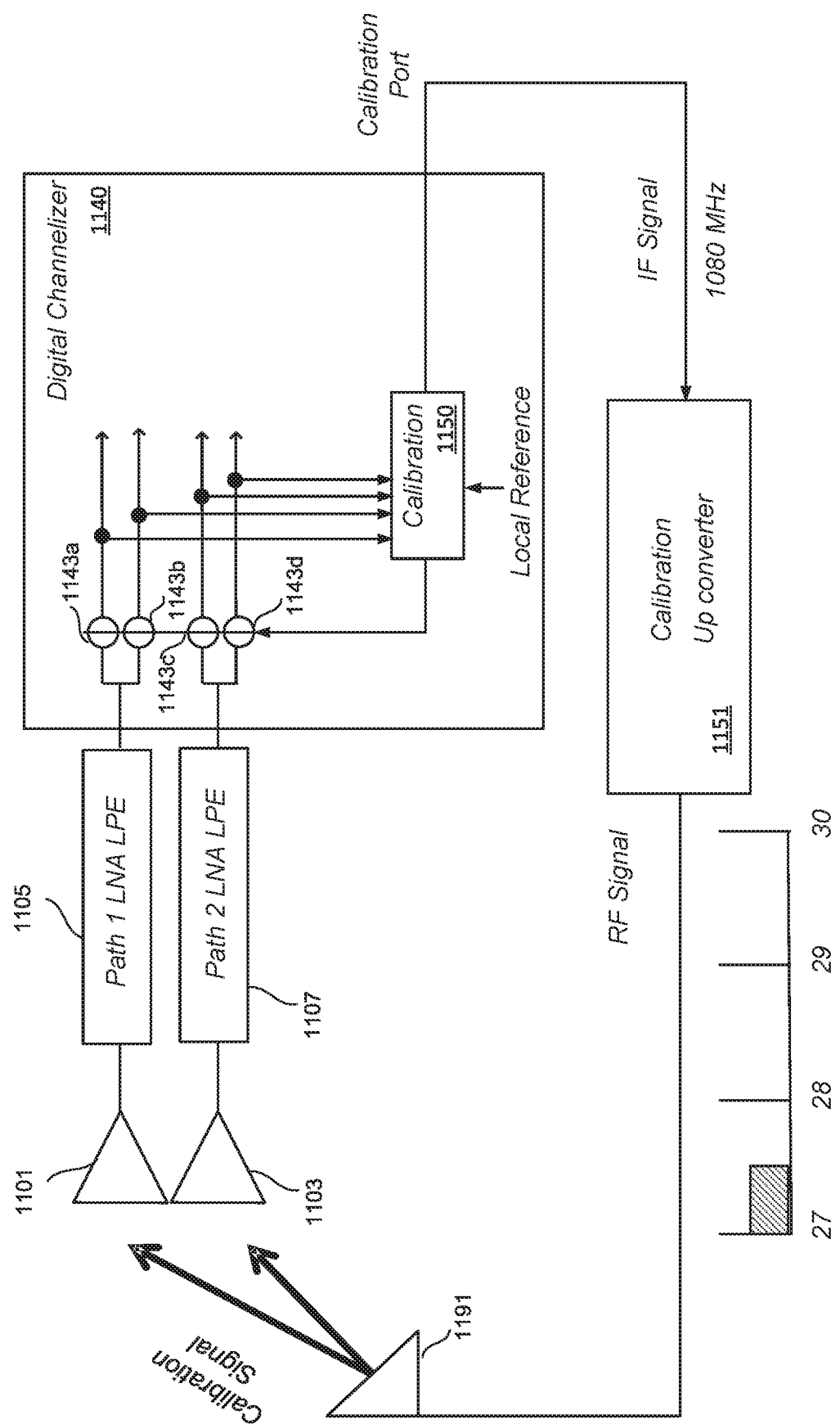
FIG. 11 is an embodiment for receive side calibration elements using a probe to inject the calibration signal.

FIG. 11 is an embodiment for receive side calibration elements using a probe to inject the calibration signal. FIG. 11 repeats many of the elements of FIG. 3, including two antennae or other input ports 1101, 1103 each connected to a corresponding input path 305, 307. A set of calibration correction elements 1143a-d are included in the sub-channel receive paths in the digital channelization section 1140. The calibration block 1150 operates as described with respect to FIGS. 3 and 4, including generating the IF calibration signal that is up-converted at block 1151 to the RF range. Rather than inject the up-converted calibration signal into each of the individual paths as in FIG. 3, a probe 1191 is introduced at the receive antenna to emit energy into the receive elements. This removes the need for the switching and tap elements for each of the paths as the calibration signal is now transmitted into all receive paths at the same time. The individual paths can then be selected and calibrated as described above with respect to FIG. 5.

Figure 12:
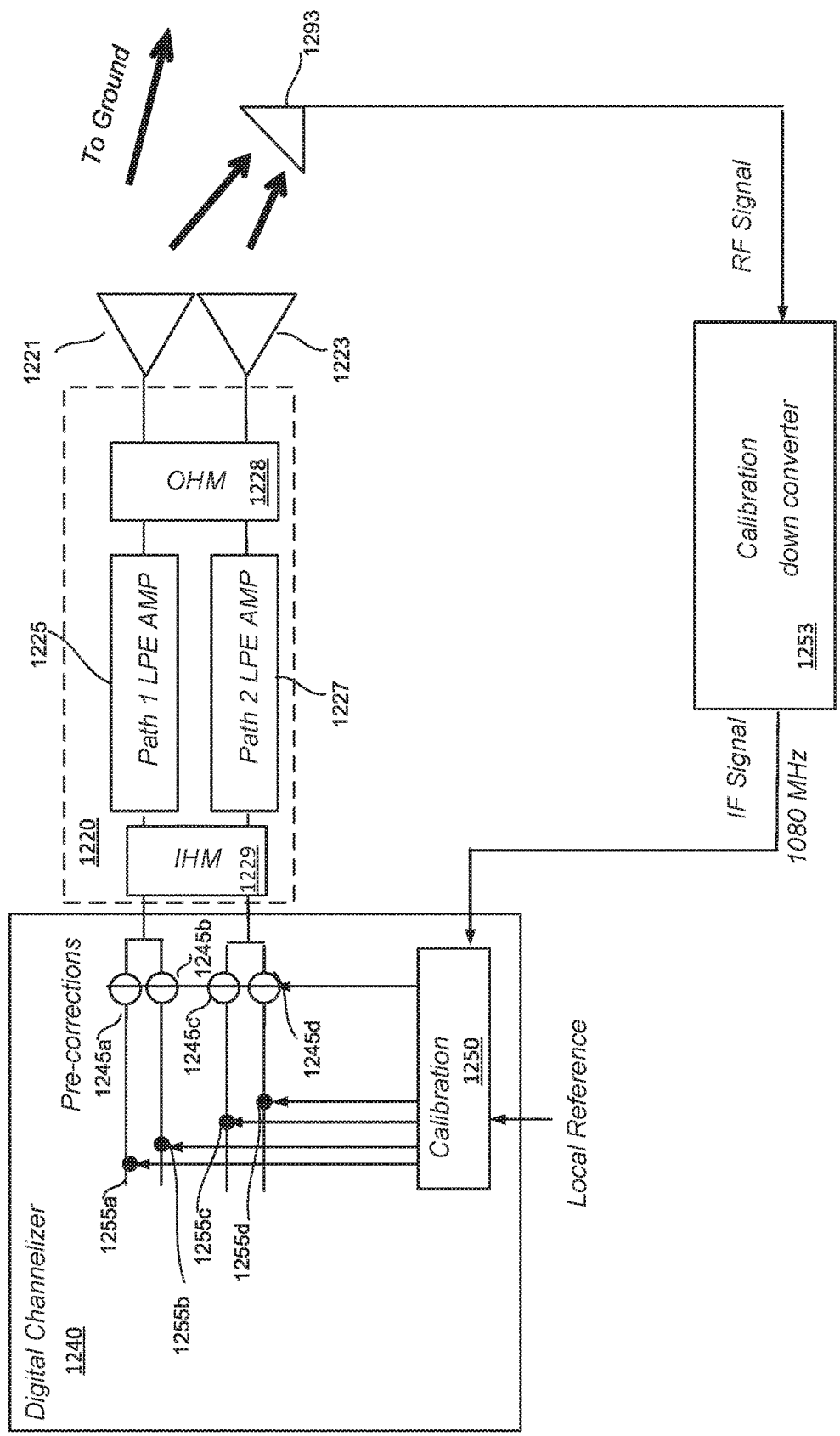
FIG. 12 is an embodiment for transmit side calibration elements using a probe to extract the propagated calibration signal.

FIG. 12 is an embodiment for transmit side calibration elements using a probe to extract the propagated calibration signal. FIG. 12 repeats many of the elements of FIG. 6, including the two antennae or other output ports 1221 and 1223 supplied signals from the output block 1220. Output block 1220 includes transmit path 1 circuitry 1225 and transmit path 2 circuitry 1227, hybrid matrix OHM 1228 and input hybrid matrix IHM 1229. The propagated calibration signal is down-converted at block 1253 and returned to the calibration block 1250, which injects the calibration signal into the sub-channels in the digital channelization section 1240. Rather than extract the calibration signal from each of the individual paths as in FIG. 6, a probe 1293 is introduced at the transmit antenna to collect energy from the transmit elements. The antenna 1221, 1223 transmit the signals to form each of the beams to the ground, part of which is picked up by the probe 1293. This removes the need for the switching and tap elements to extract the calibration signal individually from each of the paths, as the calibration signal can now be extracted from the signals received from all transmit paths by the same probe 1293. The individual paths can then be calibrated as described above with respect to FIG. 7.

For both the receive probe and transmit probe, the coupling from the probes to the elements can be characterized as part of the initial testing and calibration of the system. As with the previously described embodiments, the calibration signal is recovered by knowing the spreading code and pulling the signal out of the noise. Except for the probe portions, the rest of the calibration loop can be common mode and will not vary between the times it takes to measure the different paths. A comparison of the signal through a loop and along each of the transmit or receive paths is checked against the local reference as described above, allowing the system to estimate the difference between any two paths and calibrate it out. The variation in the probe segments can be calculated and/or measured beforehand and accounted for in the calibration. Most of the variation will typically be in the amplifiers and low power equipment (LPE) for the paths.

When drift rates for phase, gain, and delay are high, sample calibration measurements will have to be performed relatively frequently. Calibrating these parameters by measuring the gain, phase and delay of each path to fixed internal reference values can imposes an unnecessary specification on absolute drift rates. In a beamforming system, it is the relative path-to-path differences in the signals, rather that the absolute values, that are more important since if, for example, a set of beamforming signals are all out of phase, but out of phase by the same amount, they will still form a beam. Calibrating the path-to-path differences in gain, phase and delay of pairs of paths can relax the specification on absolute drift rates. The use of a Kalman filter, for example, allows for path-to-path calibration. FIG. 13 illustrates the situation.

Figure 13:
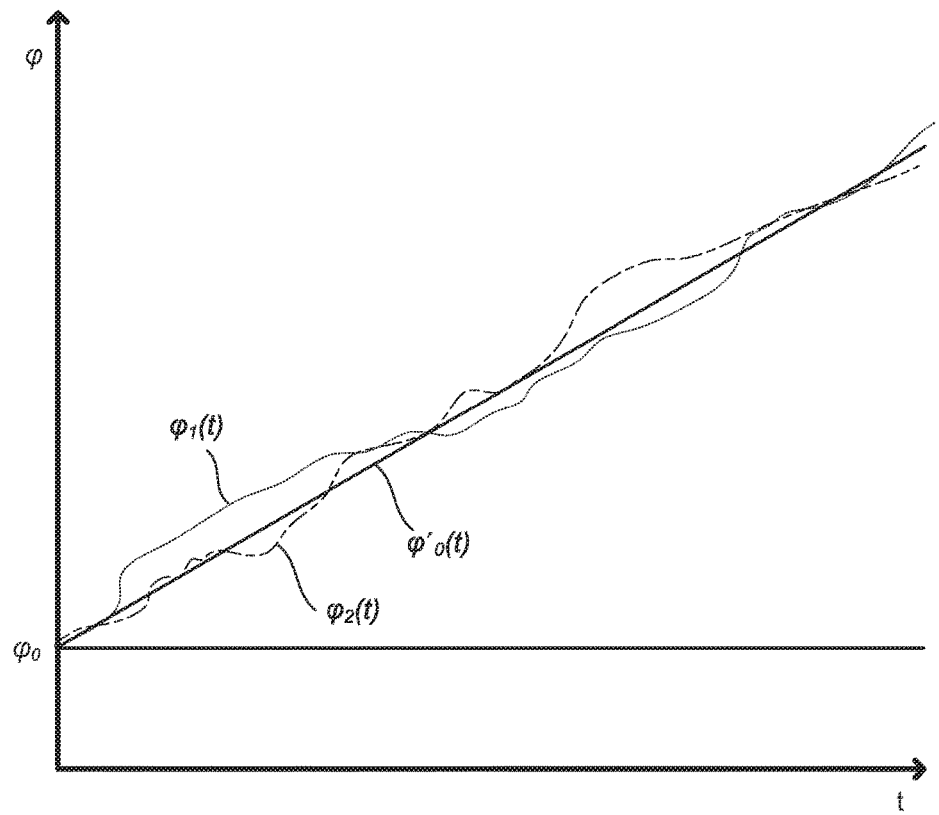
FIG. 13 illustrates the drift in phase of two paths over time.

FIG. 13 illustrates the drift in phase of two paths over time. For example, $\varphi_1(t)$ and $\varphi_2(t)$ could be the phase for paths 1 and 2 for either the receive side of FIG. 3 or the transmit side of FIG. 6. Initially, $\varphi_1(t)$ and $\varphi_2(t)$ are calibrated to an absolute phase $\varphi_0$, but over time drift. If this rate of drift is fast, the phase calibration would need to be performed frequently. However, both of $\varphi_1(t)$ and $\varphi_2(t)$ may be drifting in a similar manner, such as due to, for example, temperature variations that affect both paths similarly. Consequently, although both of $\varphi_1(t)$ and $\varphi_2(t)$ may differ significantly from an absolute phase $\varphi_0$, the path-to-path difference between them may still be close enough to each other to form a beam. The line $\varphi'_0(t)$ is an average amount of drift for $\varphi_1(t)$ and $\varphi_2(t)$ and can instead be used as the basis for determining the calibration and how often to calibrate. In FIG. 13, $\varphi'_0(t)$ is a straight line, but it can also be non-linear when the averaged drift rate varies over time.

The calibrating of path-to-path differences can utilize a Kalman filter, where the internal state is the difference between a calibration parameter and a mean for that parameter. The observables are the individual measurements against an internal reference, where transients of the sample rate are lower than the dynamics of the parameters. The Kalman estimator can smoothly track the internal state and allow correction of the path-to-path variation with tracking of the absolute drift.

The above discussion focused on the calibration of the signal paths in a satellite such that the signals from the output ports or antennae form a beam when transmitted. To do this, the signals from the different output ports need to be sufficiently well calibrated with respect to one another so that they are beamforming when incident on the desired location. Referring back to FIG. 2A, the techniques described above calibrate various portions of the paths between the input ports or antennae 201, 203 and the output ports or antennae 221, 223 so that the signals transmitted form output ports 221, 223 are calibrated well enough relative to one to form a beam. A section of the paths between the input ports 201, 203 and the output ports 221, 223 is the output block 220.

Output block 220 includes the two paths, transmit path 1 circuitry 225 and transmit path 2 circuitry 227. Each of these paths can include elements such as mixers, filters and amplifiers, including the high-powered amplifiers at the end, to generate the signals for the output ports 221 and 223. The transmit path 1 circuitry 225 and transmit path 2 circuitry 227 are both connected to the output ports 221 and 223 through output hybrid matrix OHM 228 on the one side and to the input hybrid matrix IHM 229 on the input side. The input hybrid matrix IHM 229 allows for a signal from any one of the sub-channels to be distributed across multiple transmit paths, and the output hybrid matrix OHM 228 allows signals from any of the transmit paths to be directed to any of the output ports. This is an example of a 2×2 multiport amplifier (MPA).

Rather than having each path of an MPA individually be able to handle the maximum amplification power that may be needed in a single channel, the use of the input hybrid matrix IHM 229 and the output hybrid matrix OHM 2299 in an MPA allows for the signal to be distributed across the amplification of multiple paths so that unused amplification power in underutilized channels can be used to supply extra power for paths needing higher degrees of amplification. This division of amplification allows for the individual transmit paths to use amplifiers of lower power, and consequently less cost and lower weight, which is an important concern in satellites and many other applications.

When a signal from one input to the of the input hybrid matrix IHM 229 is distributed across multiple amplification paths and then recombined in the output hybrid matrix OHM 228 for a single output of OHM 228, these signals from the different paths should be relatively well calibrated (as far as phase, gain, etc.) with respect to one another in order to properly reform the amplified signal from its components. This is a similar to the problem for beamforming satellite, except that in that case the signals from the output ports 221, 223 needed to be calibrated with respect to one another to form a beam, while in this case the different paths leading each output of the output hybrid matrix need to calibrated with respect to each other to properly produce the signal at each of the individual outputs of the output hybrid matrix OHM 228. (That is, rather than look at the how the signals from the different output ports 221, 223 will combine as a beam, the calibration of the MPA will look at each of the individual signals from the MPA before supplied to the respective output ports.) So although the point at which the combination of different paths need to be well-calibrated with respect to one another differs between beamforming and MPA calibration, the similarities of the processes allow for many of the techniques described above for a beaming forming system to be applied to multiport amplifiers.

More specifically, the following looks at multiport amplifier (MPA) input networks with compensation for MPA output network gain and phase frequency response imbalances, primarily for embodiments where the input networks are implemented in digital signal processing. In addition to satellites, MPAs can also be used in other amplification applications that can benefit from the flexibility to move power from one output channel to another, as they allow the aggregate MPA power to be shared amongst several beams or ports. The use of MPAs allows reconfiguring the output power among the different output channels in order to handle unexpected traffic imbalances and traffic variations over time. An MPA relies on parallel amplification of the signals by a group of power amplifiers with controlled or matched gain and phase responses vs frequency over time and temperature. At a basic level, an MPA includes an input hybrid matrix, a parallel group of amplifiers, and an output hybrid matrix, where FIG. 14 illustrates an example 4×4 MPA.

Figure 14:
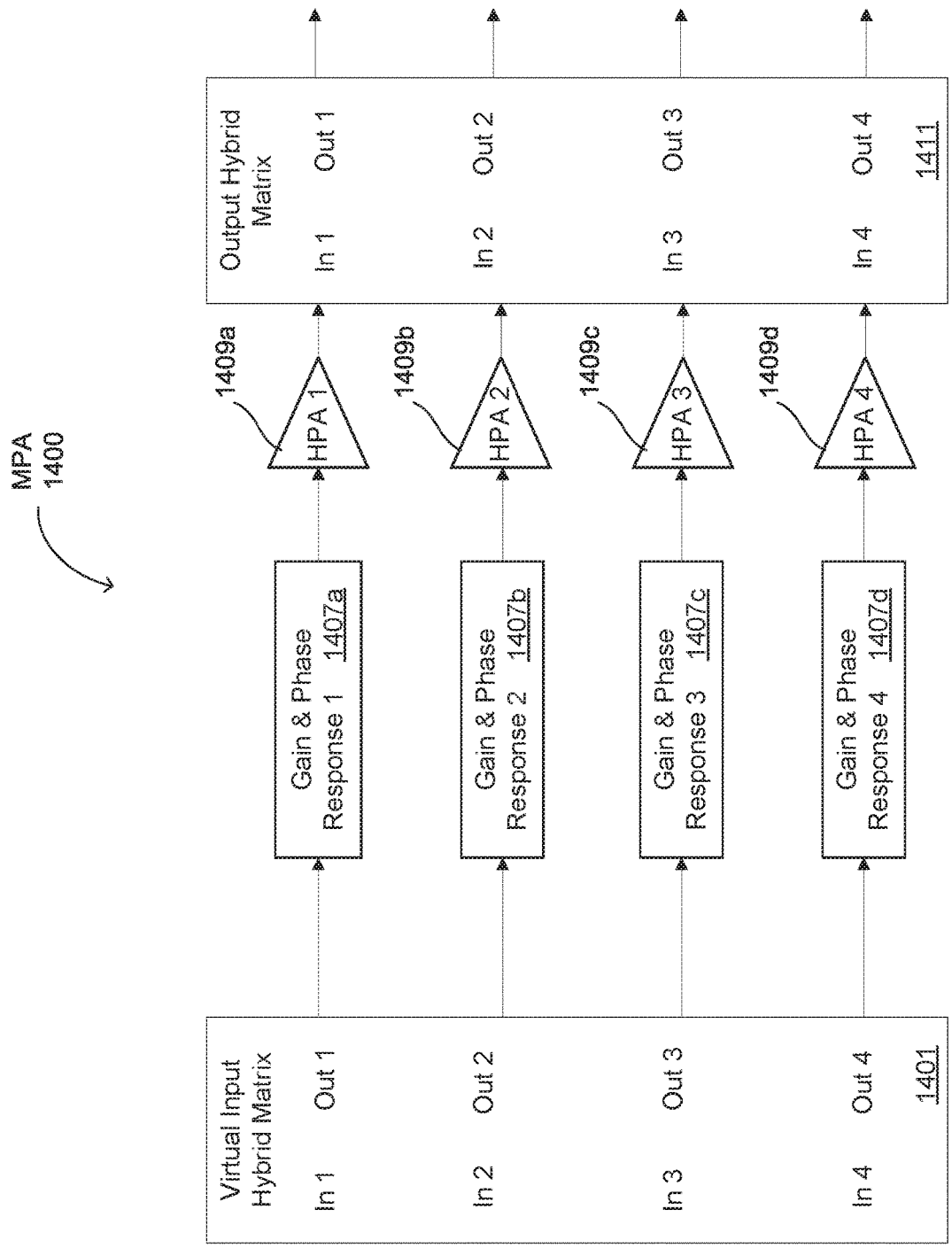
FIG. 14 is a block diagram of a 4×4 embodiment for a multiport amplifier (MPA).

FIG. 14 illustrates one example of an MPA, such as can be used at output block 220 of FIG. 2A or in other applications, here in a 4×4 embodiments of four input ports and four output ports. The four input ports of the MPA are the four inputs of the input hybrid matrix 1401. In this embodiment, the input hybrid matrix 1401 is a "virtual" input hybrid matrix as it is implemented digitally, as is discussed more below, but this need not be the case in other embodiments. The four outputs of the MPA are the four outputs of the output hybrid matrix 1411. The four outputs of the input hybrid matrix 1401 are connected to the four inputs along four amplification paths. The amplification paths can be similar to those described above with respect to FIG. 2C or other embodiments, but for this discussion each of the four paths are simplified to show a high-power amplifier HPA 1409 and a Gain & Phase Response block 1407. The high-power amplifiers HPA 1-4 1409*a-d* are treated as ideal amplifiers and any other elements in the paths between the input hybrid matrix 1401 and output hybrid matrix 1411 are grouped into Gain & Phase Response 1-4 1407*a-d* and will include any phase or gain variation in the corresponding path.

For example, the Gain & Phase Response 1-4 1407*a-d* can represent gain, phase, delay or other response errors that arise in the various stages of the paths for the MPA. Depending on the embodiment, these stages can include up-conversion from IF to RF, filters, low power amplification, digital to analog conversion, and so on. Although the high-power amplifiers are represented in FIG. 14 as elements HPA 1-4 1409*a-d*, as noted above these are treated as ideal and any path variation or non-ideal behavior from these is considered as part of the Gain & Phase Response blocks 1407*a-d*.

Figure 15:
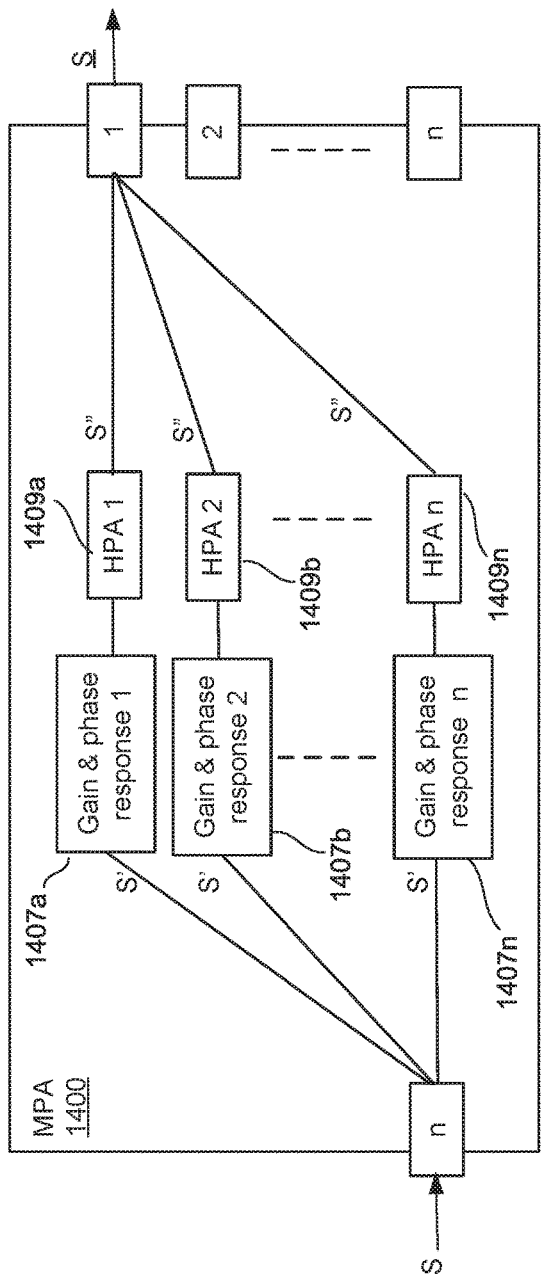
FIG. 15 illustrates the different paths from one input of a multiport amplifier to one of its outputs.

FIG. 15 considers the paths from one input of an MPA, such as illustrated in FIG. 14 except for a generalized n×n embodiment, to one of its outputs. In the simplified illustration of FIG. 15, an input signal S is received at an input port (input port n), distributed by the input hybrid matrix to the n paths, and is amplified by n amplification units HPA1-HPAn of amplification block 1409 in parallel (input hybrid matrix 1401 and output hybrid matrix 1411 are omitted for simplicity). Signal S is split into signals S' that travel along parallel pathways through gain and phase response stage blocks 1407 and amplification stages 1409, with each pathway having a gain, phase and delay response stage and an amplification unit. Thus, each pathway passes through a different gain and phase response stage. The amplified signals S" are then recombined and provided as an amplified output S at output port 1. FIG. 15 illustrates one input signal being distributed across all of the amplification pathways, but depending on the needed power and other signals concurrently in the MPA from other ports, a given input signal will be distributed across a subset of from 1 to all n of the amplification paths.

Depending on the embodiment, a calibration process can send the calibration signals along paths from one input to one output at a time, or propagate the calibration signals between multiple input and output ports concurrently. For example, spread spectrum calibration signals could be injected into multiple input ports concurrently, but with differing phases so that they may more easily be distinguished at the outputs. (In the 4×4 case, for example, the calibration signal at the four inputs could have phases of 0°, 90°, 180° and 270°.) Similarly, the calibration can be done for a single frequency bin at a time, or concurrently for multiple frequency bins.

Each of the paths between an input port and an output port passes through a different gain and phase response block. Because of this, although the signals S' may all be aligned in phase and gain, each of the signals S" may have acquired a difference in gain, phase, delay or other parameters relative to one another. Additional differences may also be introduced in input and output hybrid matrices. In order that the signals S" when recombined to properly reform to provide S at output 1 as an amplified version of S at input n, the gain, phase and delay along these paths should be equalized relative to one another.

To determine the compensation values for the MPA, the spread spectrum techniques similar to those described above for beam-forming systems can be applied to MPAs. By making periodic calibrations during active operation (such as on-orbit when an MPA is used in a satellite) of channels allows the MPAs specification of gain, phase and delay stability to be more relaxed, saving cost (for example, relaxing the path to path gain variation specification from 0.2 dB to 10 dB). Although the compensation circuitry can be implemented in both analog and digital embodiments, the discussion below is mainly given in the context of a digital implementation. Implementing the gain, phase and delay compensation circuitry within a programmable digital implementation supports adaptive corrective action compensating payload hardware gain, phase and delay variation vs time and temperature. Implementing the input hybrid matrix within a programmable digital implementation (a "virtual" input hybrid matrix) supports adaptive corrective action compensating for gain and phase errors within the output hybrid matrix vs frequency due to aging and temperature variations. This leads to lower costs and improved MPA performance, such as port-to-port isolation. Overall, this can help to reduce through lower complexity, lower weight, and reduce testing time.

Consequently, each output of output hybrid matrix is a summation of a portion of the input signal from each output of the input hybrid matrix times a unique gain and phase coefficient associated with the different paths from an input port of the input hybrid matrix to an output port of the output hybrid matrix. Although for an ideal output hybrid matrix the input hybrid matrix coefficients may be known and fixed, this will not be the case. For real world output hybrid matrix implementations, the optimum multiport amplifier performance is achieved when the input hybrid matrix coefficients can be updated in order to compensate the non-ideal real-world output hybrid matrix gain and phase coefficients.

The embodiments described here present an equalizer within the virtual input hybrid matrix that is able to adjust while in operation (on-orbit, for a satellite), in active channels the gain and phase versus frequency response for each virtual input hybrid matrix output. Having the ability to set the equalizer's gain and phase values under software command allows the virtual input hybrid matrix, through its equalizer, to adaptively compensate the gain and phase frequency response of the MPA. This can be illustrated with the embodiment of FIG. 16.

Figure 16:
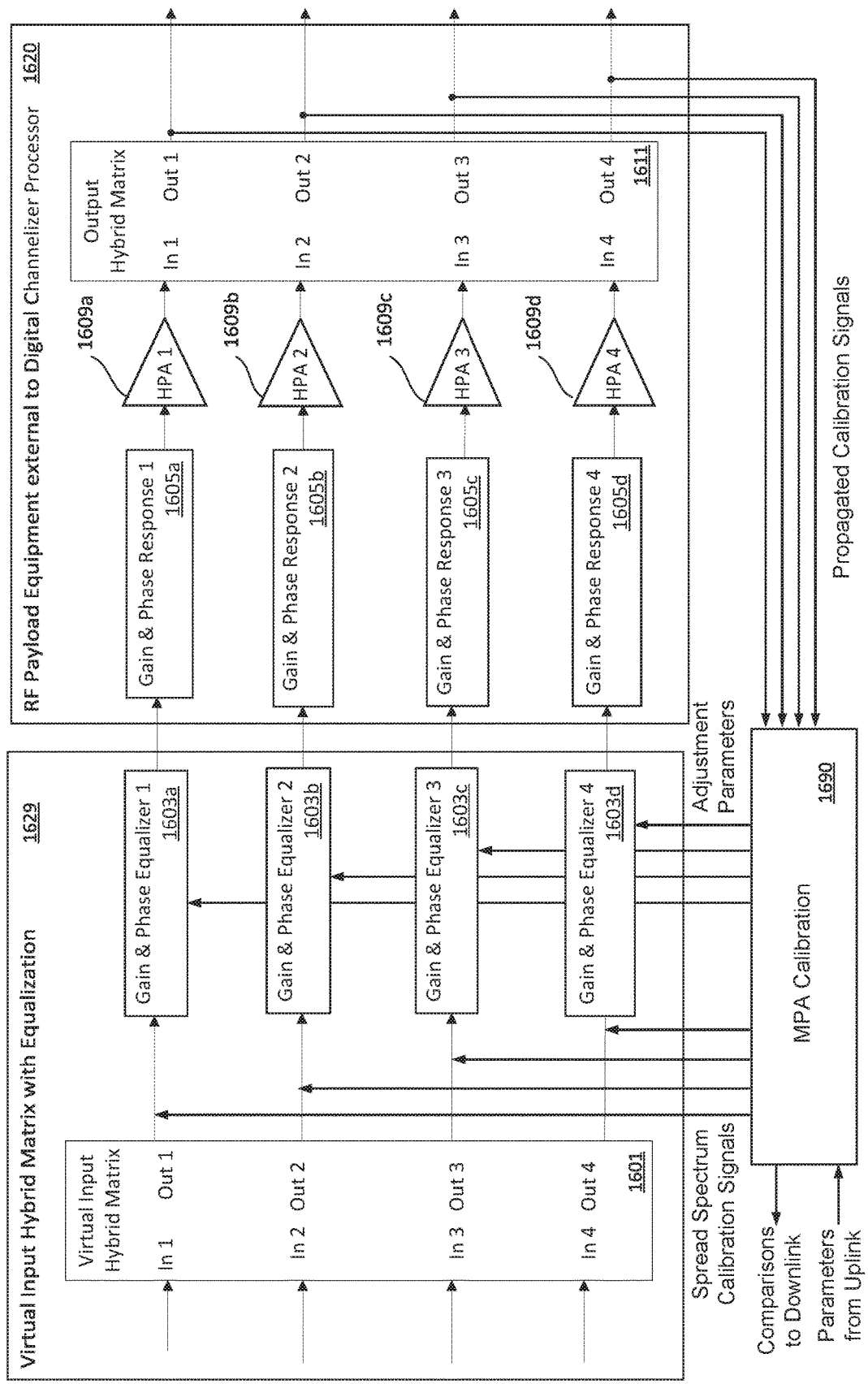
FIG. 16 illustrates an embodiment of a multiport amplifier with a virtual input hybrid matrix and gain and phase equalizers.

FIG. 16 illustrates an embodiment of a multiport amplifier with virtual input hybrid matrix and gain and phase equalizers. FIG. 16 illustrates a 4×4 embodiment as in FIG. 14 and repeats many of the elements of FIG. 14, where it will be understood that other embodiments can have more or less input and output ports. The four input ports of the MPA are the four inputs of the input hybrid matrix 1601. The four outputs of the MPA are the four outputs of the output hybrid matrix 1611. The four outputs of the input hybrid matrix 1601 are connected to the four inputs along four amplification paths. The amplification paths can again be similar to those described above with respect to FIG. 2C, but as in FIG. 14 each of the four paths are simplified to show a high-power amplifier HPA 1609 and a Gain & Phase Response block 1607. The high-power amplifiers HPA 1-4 1609a-d are treated as ideal amplifiers and any other elements in the paths between the input hybrid matrix 1601 and output hybrid matrix 1611 are grouped into Gain & Phase Response 1-4 1607a-d and will account for any phase or gain variation along the path. To compensate for the path to path variations, each path also now includes a Gain & Phase Equalizer block 1603, where each of 1603a-d can be used to equalize any path to path variations in gain, phase, delay or other factors from the corresponding one of the response blocks 1607a-d.

In this embodiment, the input hybrid matrix 1601 is a "virtual" input hybrid matrix as in is implemented digitally, but this need not be the case in other embodiments. More specifically, the virtual input hybrid matrix 1601 and the gain and phase equalizer blocks 1-4 1603a-d are part of a virtual input hybrid matrix with equalization 1629. When implemented in a satellite embodiment as in FIG. 2A, the virtual input hybrid matrix with equalization 1629 can be part of the digital channelizer processor block 240. The gain and phase response blocks 1607a-d, HPAs 1607a-d, and output hybrid matrix 1611 can then be part of the RF payload equipment external to the digital channelizer processor block 240. In FIG. 2A, this can be thought of as moving in the input hybrid matrix from the output block 220 to the digital channelizer block 240, as is illustrated in FIG. 17.

Figure 17:
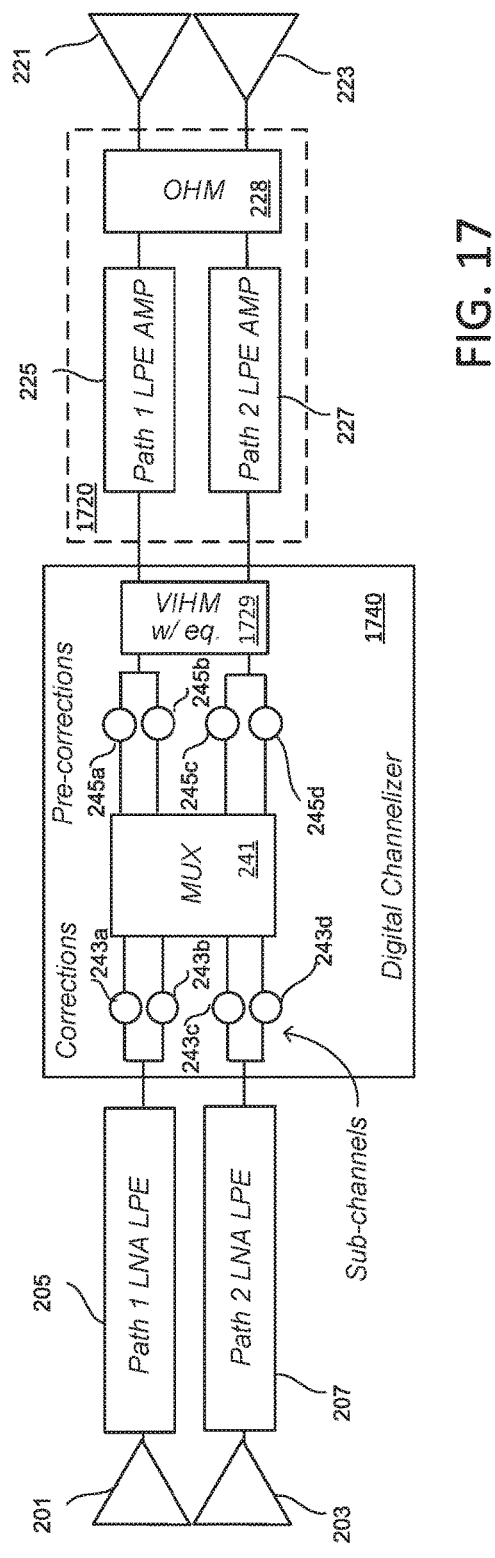
FIG. 17 is a block diagram of a satellite or other beamforming apparatus that incorporates a multiport amplifier with a virtual input hybrid matrix and gain and phase equalizers as in FIG. 16.

FIG. 17 is a block diagram of a satellite or other beamforming apparatus for an example of two input ports and two output ports and repeats many of the elements of FIG. 2A, but also incorporates a multiport amplifier with virtual input hybrid matrix and gain and phase equalizers as in FIG. 16. More specifically, the digital channelizer processor block 1640 now includes virtual input hybrid matrix and gain and phase equalizers VIHQ w/eq. 1629, as on the left-hand side of FIG. 16 (in a 2×2 embodiment), which is no longer in the output block 1620. The other elements of FIG. 16 can be much as described above with respect to FIG. 2A.

By implementing the input hybrid matrix and the gain and phase equalizer blocks 1-4 1603a-d in a digital embodiment as part of a virtual input hybrid matrix, this allows for the equalization of the different paths to performed by use of mathematical algorithms. This allows for lighter weight and higher accuracy relative to an analog embodiment, with the virtual input hybrid matrix including equalization 1729 being implemented as part of the digital portion of the satellite.

Returning to FIG. 16, the block diagram of FIG. 16 also includes elements of an embodiment for some of the elements for determination of the parameter values for the gain and phase equalizer blocks 1603a-d for the different paths. Similar to the procedure described above for beamforming system, a spread spectrum signal is injected to the MPA, propagated through the different paths to one of the output ports, extracted and then the extracted is compared to the injected signal by the MPA calibration block 1690.

The MPA calibration block 1690 is connected to inject the calibration signal at the injection ports 1652a-d into each of the paths of the MPA. The calibration signal can again be a spread spectrum signal generated by the MPA calibration block 1690 that has a power level below the thermal noise floor of a customer or user signal active in the channel, allowing the calibration to be performed without disruption in service of the MPA. The calibration signals are then propagated through the gain & phase equalizer blocks 1603a-d, the gain & phase response blocks 1605q-d, high power amplifiers 1607a-d, and then through output hybrid matrix 1622, where the propagated calibration signals can be extracted at the calibration extraction ports 1654a-d. In the embodiment of FIG. 16, the calibration signals are injected after the virtual input hybrid matrix 1601, but before the gain & phase equalizer blocks 1603a-d, although other embodiments can be used. For example, in other embodiments the calibration signals could be injected before the virtual input hybrid matrix 1601. Similarly, the propagated calibration signals can be extracted at differing locations to, for example, look at error from a segment of the MPA's signal path.

Once the MPA calibration block 1690 block receives back the propagated calibration signal, this can be compared to the injected signal. Based on the comparison, the adjustment parameters for the gain & phase equalizer blocks 1603a-d can be determined. For example, in a satellite embodiment, the comparison data can be transmitted to the ground, where the adjustment parameters can be computed and transmitted back to the satellite. In some embodiments, this can be done by a dedicated downlink to transmit the comparison data to, for example, Network Control Center at shown at 130 of FIG. 1, and a dedicated uplink to send the adjustment parameters back. This can simplify the MPA calibration circuitry required on the satellite, but requires the link to the ground. In other embodiments, the parameters can be determined by the MPA calibration block 1690, such as by use of look up tables or computation algorithms.

Figure 18:
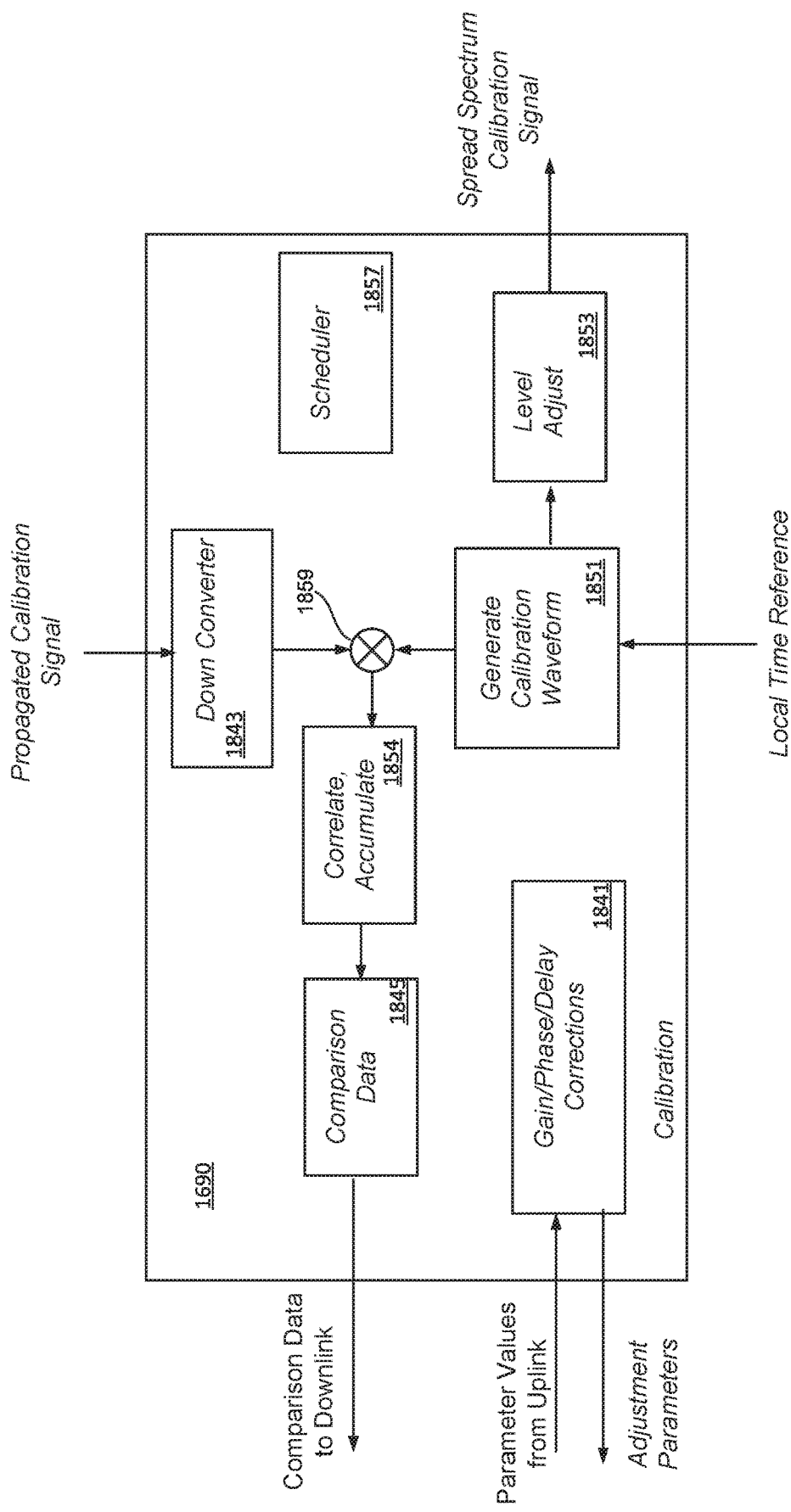
FIG. 18 looks at one embodiment for the MPA calibration block of FIG. 16 in more detail.

FIG. 18 looks at one embodiment for the MPA calibration block of FIG. 16 in more detail. Block 1851 receives a local time reference and from this generates the spread spectrum calibration signal, which then has its power level adjusted at block 1853, providing the spread signal, low power calibration signal for injection. After injection and propagating through a path of the multiport amplifier, the propagated calibration signal is extracted. For the satellite example, the MPA up converts an IF frequency signal to an RF frequency signal. Consequently, the injected signal will be in the IF range and the extracted signal in the RF range and will need to be down converted at block 1843. Similarly, if the MPA were to down convert the input signal, the propagated would be up converted at this point; and if there were no frequency range conversion, then the block 1843 would be omitted. The propagated calibration signal is then received at the multiplier 1859, where it is combined with the original calibration waveform, the result going to the correlation/accumulation block 1854. The resultant comparison data can then be accumulated at block 1845 and then transmitted out by a downlink, the correction value computed, transmitted back by an uplink to the gain/phase/delay corrections block 1841. In some embodiments the downlink and uplinks can be dedicated. In still other embodiments, the gain/phase/delay corrections can be computed on-board. For any of the embodiments, the gain/phase/delay corrections block 1841 can then supply the adjustment parameters to the gain & phase equalizer blocks 1603*a-d*. A scheduler 1857 can determine which paths of the MPA are to be calibrated and when.

Figure 19:
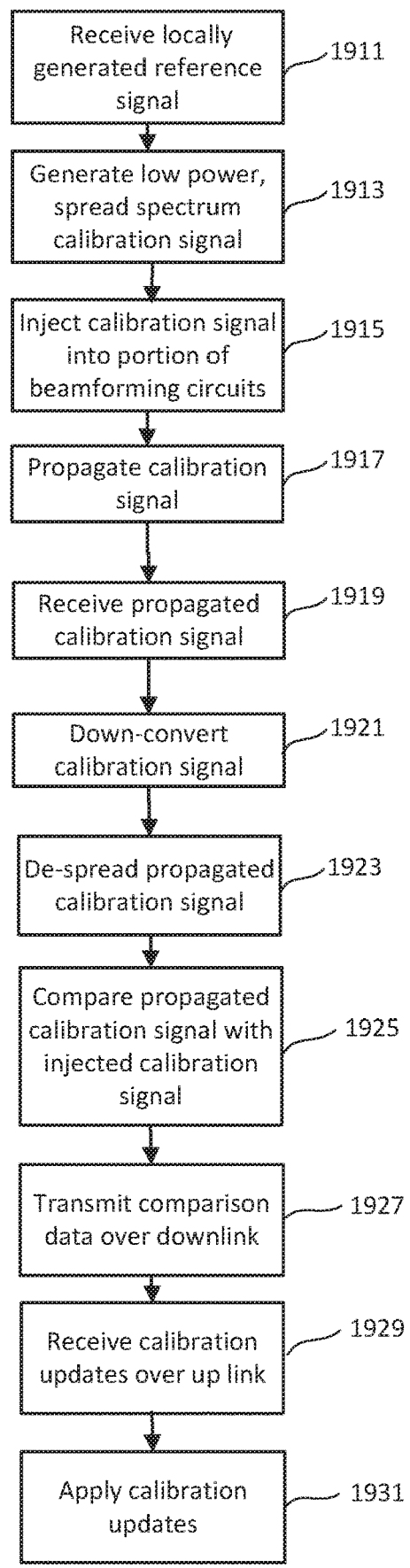
FIG. 19 is a flow chart illustrating one embodiment for an MPA calibration operation using a spread spectrum, low power calibration signal.

FIG. 19 is a flow chart illustrating one embodiment for an MPA calibration operation using a spread spectrum, low power calibration signal as described with respect to FIGS. 14-18 As with the satellite calibration process described earlier, the use of the spread spectrum, low power calibration signal allows for the MPA to be calibrated while active, although the calibration operation can also be performed when the multiport amplifier is otherwise not active, such as part of a test mode.

FIG. 19 describes an MPA calibration operation that can be performed while the amplifier is active. Beginning at step 1911 a reference signal, such as a pseudo-random noise signal, is generated by block 1851. At step 1913 the spread spectrum calibration signal is then generated from the pseudo-random noise sequence and in one embodiment can reside in a 1 MHz sub channel and set to a power level below the thermal noise floor (such as 17 dB below) of the user signals in the MPA paths. If the calibration signal need to be up-converted or down-converted, this can be done prior to injecting the calibration signal into one or more of the MPA paths at step 1915. The calibration for different paths can be performed sequentially according to a schedule based on how quickly the calibration of the different channels are found to drift. The injected calibration signal is then propagated through selected paths of the MPA at step 1917.

After the injected signal propagates the selected path, it is received back at the calibration block at step 1919. If the MPA up-converts the signals along it path, as FIG. 2C, the extracted calibration signal can then be down-converted at step 1921. Similarly, if the MPA down-converts signals, any up-conversion or other needs processes can be done at this time. The propagated calibration is then de-spread at step 1923. The de-spread signal can then be compared to the original reference signal at step 1925. In an embodiment where the calibration block does not determine the calibration parameters itself, the comparison data is then sent out and the calibration parameters are then received back. For example, on a satellite embodiment, the comparison data can then be transmitted out over a dedicated downlink at step 1927 with the computed calibration updates then received over a dedicated uplink at step 1929. In other embodiments, the updates can be determined as part of the calibration block 1690. The update corrections are then applied to the gain & phase equalizer blocks 1603*a-d* at step 1931.

As with the calibration of a beamforming device, a number of alternate embodiments are possible for the calibration of an MPA. For example, as with a beamforming system, in an MPA it is the relative path-to-path phase, gain and delay differences when the signals from the different paths are recombined in the output hybrid matrix that usually matter more than the absolute values. Consequently, the paths can be calibrated based on path-to-path differences as described above with respect to FIG. 13, rather than with respect to fixed nominal values.

As described with respect to FIG. 10 for the beamforming example, in the MPA calibration process the dwell or integration time for a given path can be based on the power in the channel. As a path with a signal of lower power will have a lower S/N value, the dwell or accumulation time for measurement for determining the error in a path can be made a function of the power, with less integration time spent on lower power paths and only the most powerful signals requiring the maximum dwell time.

FIG. 15 illustrates the paths from a single input port of an MPA to a single output port. Rather than running the calibration signal along a single path at a time, or even from a single input port or to a single output port at a time, the calibration signal can be entered into, and extracted from, multiple ports at the same time. The calibration signals can be injected into multiple paths/ports, extracted from multiple paths/ports concurrently, or both and then separated out to determine the parameters for each of the gain and phase equalizer blocks. For example, in each of the four input ports of the virtual hybrid input matrix 1401 of FIG. 14 could have a spread spectrum calibration signal injected at the same time, but with these signals having a relative phase of 90° between each of the ports, allowing these to de distinguished at the outputs of the output hybrid matrix 1411. This can be affected either by injection and extraction ports or through use of probes such as 1191 of FIG. 11 and 1293 of FIG. 12.

Again, similarly to as described for the beam forming circuitry with respect to FIG. 9, rather than calibrate the paths of an MPA as a whole, portions of the paths can be calibrated followed by full path calibrations.

In a first set of embodiments, an amplifier system includes an input network having a plurality of input ports and an output network having a plurality of output ports. A plurality of amplification units are coupled between the input network and the output network, where the plurality of amplification units configured to amplify signals from the plurality of input ports. A plurality of equalizers are each coupled between the input network and the output network in series with a corresponding one of the amplification units, and are configured to equalize signal path of the corresponding amplification unit between the input ports and the output ports. One or more calibration circuits are configured to generate a calibration signal and inject the calibration signal into a plurality of the paths between the input ports and the output ports before the equalizers concurrently with the amplifier system propagating one or more user signals along the paths between the input ports and the output ports. The calibration signal is a spread spectrum signal with a power level lower than a noise floor of the one or more user signals. The one or more calibration circuits are further configured to receive the injected calibration signal from one or more of the output ports after propagation through the amplifier system and perform a comparison of the injected calibration signal to the calibration signal after propagating through the amplifier system.

In another set of embodiments, a satellite has multiple receive antennae and multiple transmit antennae. A multiport amplifier is coupled between the receive antennae and the transmit antennae. The multiport amplifier includes an input hybrid matrix coupled to multiple ones of the receive antennae, an output hybrid matrix coupled to multiple ones of the transmit antennae, and a plurality of amplification units coupled between the input hybrid matrix and the output hybrid matrix, the plurality of amplification units configured to amplify signals from the input hybrid matrix. The multiport amplifier also includes a plurality of equalizers, each coupled between the virtual input network and the output hybrid matrix in series with a corresponding one of the amplification units, the equalizers configured to equalize signal paths between the receive antennae and the transmit antennae through the plurality of amplification units. One or more calibration circuits are connected to the multiport amplifier, where the calibration circuits configured to generate and inject a calibration signal into a plurality of signal paths of the multiport amplifier before the equalizers concurrently with the multiport amplifier propagating one or more user signals along the signal paths. The calibration signal is a spread spectrum signal with a power level lower than a noise floor of the one or more user signals. The one or more calibration circuits are further configured to receive the injected calibration signal after propagation through the multiport amplifier and perform a comparison of the injected calibration signal to the calibration signal after propagating through the multiport amplifier.

Other embodiments present methods including performing a calibration operation on a multiport amplifier circuit. The calibration operation includes generating a spread spectrum calibration signal; injecting the spread spectrum calibration signal into one or more paths of a multiport amplifier; and receiving the injected calibration signal after propagating through at least a portion of the one or more paths of the multiport amplifier. A comparison is performed of the injected calibration signal to the calibration signal after propagating through the portion of the one or more paths of the multiport amplifier. A calibration operation is performed on the multiport amplifier with parameters based on the comparison.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A method, comprising:
    performing a calibration operation on a multiport amplifier circuit, including:
        generating a spread spectrum calibration signal;
        injecting the spread spectrum calibration signal into one or more paths of the multiport amplifier circuit;
        receiving the injected calibration signal after propagating through at least a portion of the one or more paths of the multiport amplifier circuit;
        performing a comparison of the injected calibration signal to the calibration signal after propagating through the portion of the one or more paths of the multiport amplifier circuit; and
        performing a calibration operation on the multiport amplifier circuit with parameters based on the comparison.

2. The method of claim 1, further comprising:
    receiving one or more user signals at one or more input ports of the multiport amplifier circuit;
    amplifying the user signals by one or more of the paths of the multiport amplifier circuit; and
    providing the amplified user signals at one or more output ports of the multiport amplifier circuit,
    where the calibration operation on the multiport amplifier circuit is performed concurrently with the amplifying.

3. The method of claim 1, wherein the multiport amplifier circuit in part of a satellite and the calibration operation further comprises:
    transmitting of a result of the comparison over a downlink; and
    receiving the parameters over an uplink.

4. The method of claim 1, wherein the multiport amplifier circuit in part of a satellite and the calibration operation further comprises:
    determining the parameters based from the comparison.

5. The method of claim 1, wherein the multiport amplifier circuit comprises an input network having a plurality of input ports, an output network having a plurality of output ports, a plurality of amplification units coupled between the input network and the output network, and a plurality of equalizers, each coupled between the input network and the output network in series with a corresponding one of the amplification units, wherein the one or more paths are signal paths of the corresponding amplification unit between the input ports and the output ports, the method further comprising:
    amplifying by the amplification units of signals received at the input ports;
    equalizing by the equalizers of the paths of the corresponding amplification units between the input ports and the output ports; and
    wherein injecting the spread spectrum calibration signal into one or more paths of a multiport amplifier circuit includes injecting the spread spectrum calibration signal into a plurality of the paths between the input ports and the output ports before the equalizers.

6. The method of claim 5, wherein the method further includes:
concurrently with injecting the spread spectrum calibration signal into one or more paths of a multiport amplifier circuit, propagating one or more user signals along the paths between the input ports and the output ports.

7. The method of claim 5, further comprising:
implementing the input network and the equalizers as virtual input hybrid matrix.

8. The method of claim 5, wherein performing a calibration operation includes:
individually adjusting paths propagating thought the equalizers.

9. The method of claim 8, wherein individually adjusting paths propagating thought the equalizers includes:
adjusting a phase of signals propagating through the equalizers.

10. The method of claim 8, wherein individually adjusting paths propagating thought the equalizers includes:
adjusting an amplitude of signals propagating through the equalizers.

11. The method of claim 8, wherein individually adjusting paths propagating thought the equalizers includes:
determining parameters to individually adjust signal paths propagating though the equalizers based on the comparison of the injected calibration signal to the calibration signal after propagating through the multiport amplifier circuit.

12. The method of claim 11, wherein the one or more paths are a plurality of paths and determining parameters to individually adjust signal paths propagating though the equalizers includes:
determining the parameters based on path to path differences between the plurality of paths.

13. The method of claim 8, further comprising:
providing data based on the comparison of the injected calibration signal to the calibration signal after propagating through the multiport amplifier circuit; and
receiving parameters to individually adjust the paths propagating though the equalizers.

14. The method of claim 5, wherein injecting the spread spectrum calibration signal into one or more paths of the multiport amplifier circuit comprises:
injecting the calibration signal into the paths after the input network.

15. The method of claim 5, wherein injecting the spread spectrum calibration signal into one or more paths of the multiport amplifier circuit comprises:
injecting the calibration signal into the paths before the input network.

16. The method of claim 5, wherein injecting the spread spectrum calibration signal into one or more paths of the multiport amplifier circuit comprises:
injecting the calibration signal into a plurality of the input ports concurrently.

17. The method of claim 5, wherein receiving the injected calibration signal comprises:
receiving the injected calibration signal from a plurality of the output ports concurrently.

* * * * *

UNITED STATES PATENT AND TRADEMARK OFFICE
CERTIFICATE OF CORRECTION

PATENT NO. : 10,673,399 B2  
APPLICATION NO. : 16/405162  
DATED : June 2, 2020  
INVENTOR(S) : Elwailly et al.

Page 1 of 1

It is certified that error appears in the above-identified patent and that said Letters Patent is hereby corrected as shown below:

On the Title Page

Abstract, Line 8: After "spend" and before "calibrating" delete "spend" and insert -- spent --.

In the Claims

Column 23, Line 16 (Claim 8, Line 3): After "propagating" and before "the" delete "thought" and insert -- through --.

Column 23, Line 19 (Claim 9, Line 2): After "propagating" and before "the" delete "thought" and insert -- through --.

Column 23, Line 23 (Claim 10, Line 2): After "propagating" and before "the" delete "thought" and insert -- through --.

Column 23, Line 27 (Claim 11, Line 2): After "propagating" and before "the" delete "thought" and insert -- through --.

Column 23, Line 29 (Claim 11, Line 4): After "propagating" and before "the" delete "thought" and insert -- through --.

Column 24, Line 3 (Claim 12, Line 3): After "propagating" and before "the" delete "thought" and insert -- through --.

Column 24, Line 12 (Claim 13, Line 6): After "propagating" and before "the" delete "thought" and insert -- through --.

Signed and Sealed this  
Eighth Day of September, 2020

Andrei Iancu  
*Director of the United States Patent and Trademark Office*